US010211259B2

(12) United States Patent
Oga et al.

(10) Patent No.: US 10,211,259 B2
(45) Date of Patent: Feb. 19, 2019

(54) SEMICONDUCTOR MEMORY DEVICE AND METHOD OF MANUFACTURING THE SAME

(71) Applicant: TOSHIBA MEMORY CORPORATION, Minato-ku, Tokyo (JP)

(72) Inventors: Atsushi Oga, Mie (JP); Mutsumi Okajima, Mie (JP); Natsuki Fukuda, Mie (JP); Takeshi Yamaguchi, Mie (JP); Toshiharu Tanaka, Mie (JP); Hiroyuki Ode, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/465,049

(22) Filed: Mar. 21, 2017

(65) Prior Publication Data

US 2017/0373119 A1  Dec. 28, 2017

Related U.S. Application Data

(60) Provisional application No. 62/353,913, filed on Jun. 23, 2016.

(51) Int. Cl.
*H01L 27/24* (2006.01)
*H01L 45/00* (2006.01)

(52) U.S. Cl.
CPC ........ *H01L 27/249* (2013.01); *H01L 27/2454* (2013.01); *H01L 45/1226* (2013.01); *H01L 45/146* (2013.01); *H01L 45/16* (2013.01)

(58) Field of Classification Search
CPC .............. H01L 27/249; H01L 45/1226; H01L 45/1675; H01L 27/2436; H01L 45/146
See application file for complete search history.

(56) References Cited

U.S. PATENT DOCUMENTS

| | | | |
|---|---|---|---|
| 8,822,971 B2 | 9/2014 | Park et al. | |
| 8,912,521 B2 | 12/2014 | Nojiri et al. | |
| 8,958,228 B2 | 2/2015 | Samachisa et al. | |
| 9,018,613 B2 | 4/2015 | Nojiri et al. | |
| 9,224,788 B2 | 12/2015 | Kobayashi et al. | |
| 2009/0251963 A1* | 10/2009 | Seol et al. | G11C 16/04 365/185.05 |
| 2011/0140068 A1* | 6/2011 | Ozawa | H01L 27/249 257/4 |

\* cited by examiner

*Primary Examiner* — Julia Slutsker
(74) *Attorney, Agent, or Firm* — Foley & Lardner LLP

(57) ABSTRACT

A semiconductor memory device according to an embodiment comprises: a semiconductor substrate extending in a first direction and a second direction, the first and second directions intersecting each other; a first wiring line disposed above the semiconductor substrate and extending in the first direction; a second wiring line disposed above the semiconductor substrate and extending in a third direction, the third direction intersecting the first direction and the second direction; a variable resistance film disposed at an intersection of the first wiring line and the second wiring line; a first insulating film disposed aligned with the second wiring line in the first direction; a first film disposed between the first wiring line and the first insulating film; and a second film disposed between the first insulating film and the first film and configured from a material different from that of the first film.

8 Claims, 21 Drawing Sheets

SEMICONDUCTOR MEMORY DEVICE AND METHOD OF MANUFACTURING THE SAME

CROSS-REFERENCE TO RELATED APPLICATION

This application is based upon and claims the benefit of priority from the prior U.S. Provisional Application 62/353,913, filed on Jun. 23, 2016, the entire contents of which are incorporated herein by reference.

BACKGROUND

Field

Embodiments of the present invention relate to a semiconductor memory device and a method of manufacturing the same.

Description of the Related Art

A flash memory is a semiconductor memory device known for its low cost and large capacity. One example of a semiconductor memory device to replace the flash memory is a variable resistance type memory (ReRAM: Resistance RAM) which employs a variable resistance film in its memory cell. The ReRAM can configure a cross-point type memory cell array, hence can achieve a similar increase in capacity to the flash memory. Moreover, in order to further increase capacity, there is also being developed a ReRAM having a so-called VBL (Vertical Bit Line) structure in which bit lines which are selection wiring lines are arranged in a perpendicular direction to a semiconductor substrate.

DETAILED DESCRIPTION

A semiconductor memory device according to an embodiment comprises: a semiconductor substrate extending in a first direction and a second direction, the first and second directions intersecting each other; a first wiring line disposed above the semiconductor substrate and extending in the first direction; a second wiring line disposed above the semiconductor substrate and extending in a third direction, the third direction intersecting the first direction and the second direction; a variable resistance film disposed at an intersection of the first wiring line and the second wiring line; a first insulating film disposed aligned with the second wiring line in the first direction; a first film disposed between the first wiring line and the first insulating film; and a second film disposed between the first insulating film and the first film and configured from a material different from that of the first film.

Semiconductor memory devices and methods of manufacturing the same, according to embodiments will be described below with reference to the drawings.

First Embodiment

First, an overall configuration of a semiconductor memory device according to a first embodiment will be described.

Figure 1:
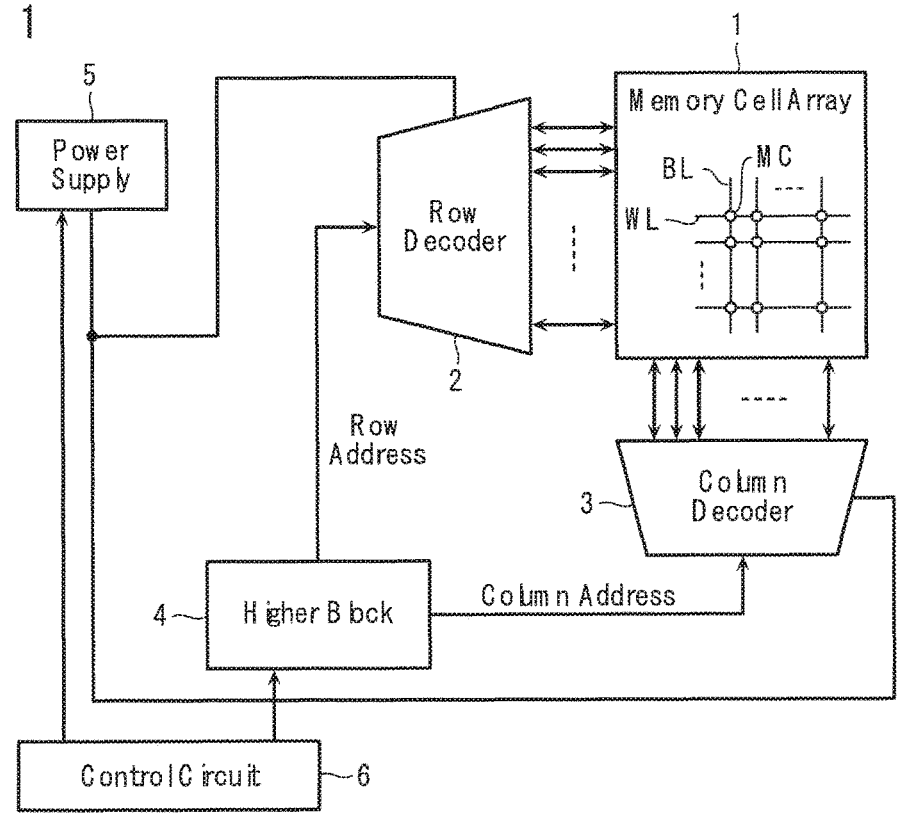
FIG. 1 is a view showing functional blocks of a semiconductor memory device according to a first embodiment.

FIG. 1 is a view showing functional blocks of the semiconductor memory device according to the present embodiment.

As shown in FIG. 1, the semiconductor memory device of the present embodiment comprises: a memory cell array 1; a row decoder 2; a column decoder 3; a higher block 4; a power supply 5; and a control circuit 6.

The memory cell array 1 includes: a plurality of word lines WL and a plurality of bit lines BL; and a plurality of memory cells MC selected by these word lines WL and bit lines BL. The row decoder 2 selects the word line WL during an access operation. The column decoder 3 includes a driver that, during the access operation, selects the bit line BL to control the access operation. The higher block 4 selects the memory cell MC which is to be an access target in the memory cell array 1. The higher block 4 provides a row address and a column address to, respectively, the row decoder 2 and the column decoder 3. The power supply 5, during write/read of data, generates certain combinations of voltages corresponding to respective operations, and supplies these combinations of voltages to the row decoder 2 and the column decoder 3. The control circuit 6 sends the addresses to the higher block 4 to control the higher block 4, and also performs control of the power supply 5, based on a command from external.

Next, a circuit of the memory cell array 1 will be described.

Figure 2:
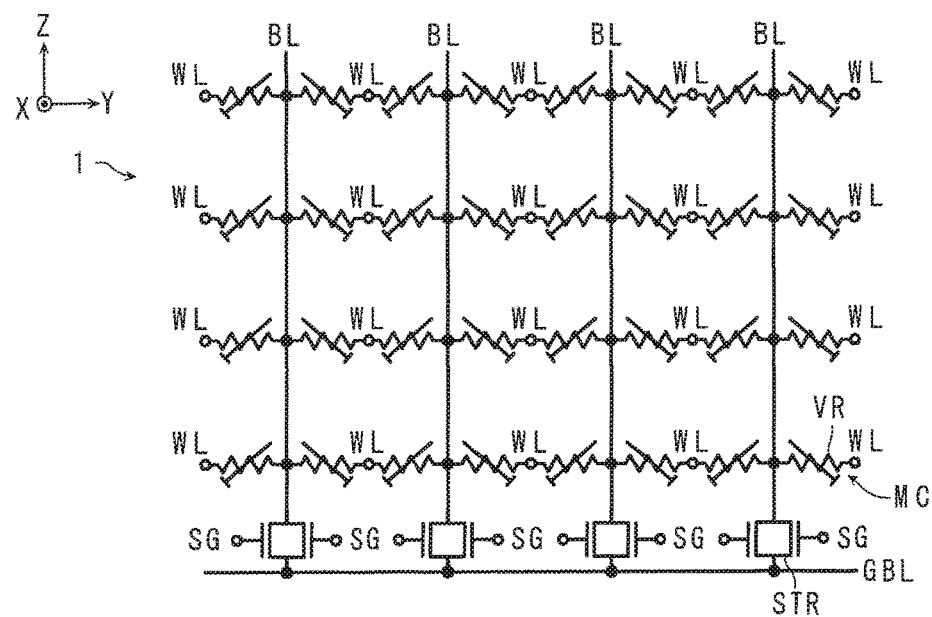
FIG. 2 is a circuit diagram of a memory cell array of the semiconductor memory device according to the same embodiment.

FIG. 2 is a circuit diagram of the memory cell array of the semiconductor memory device according to the present embodiment.

As shown in FIG. 2, the memory cell array 1 includes the plurality of memory cells MC disposed at intersections of the plurality of word lines WL and the plurality of bit lines BL. Each of the memory cells MC includes a variable resistance film VR whose both ends are electrically connected to both wiring lines of a certain word line WL and a certain bit line BL. In addition, the memory cell array 1 includes a global bit line GBL. Several bit lines BL are commonly connected, each via a select transistor STR, to one global bit line GBL. Each of the bit lines BL is controlled by a select gate SG.

Next, a structure of the memory cell array 1 will be described.

Hereafter, the memory cell array 1 of the present embodiment will sometimes also be shown assigned with a reference symbol 100 in order to distinguish it from a memory cell array 1 of another embodiment and a comparative example.

Figure 3:
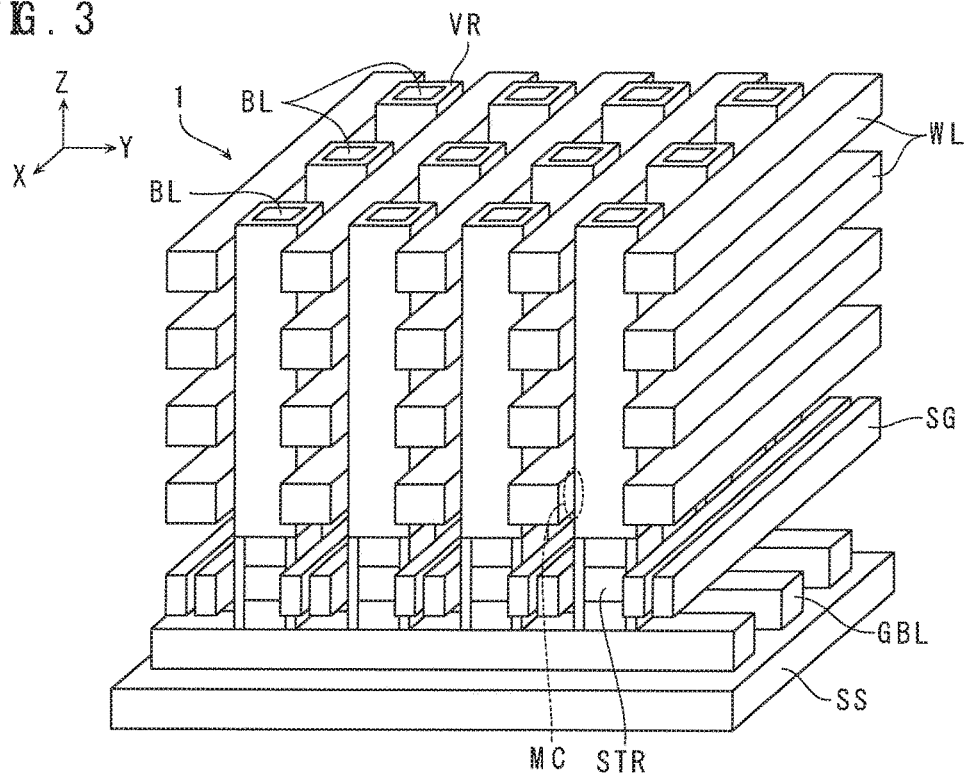
FIG. 3 is a view showing a schematic structure of the memory cell array of the semiconductor memory device according to the same embodiment.
Figure 4:
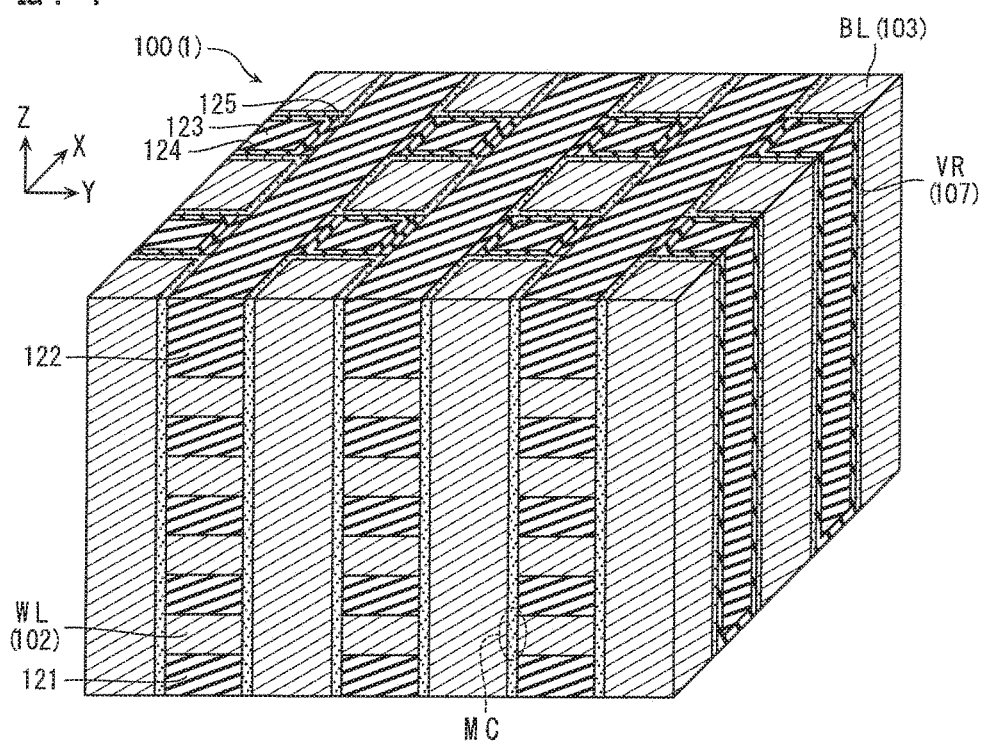
FIGS. 4 and 5 are views showing the structure of the memory cell array of the semiconductor memory device according to the same embodiment.
Figure 5:
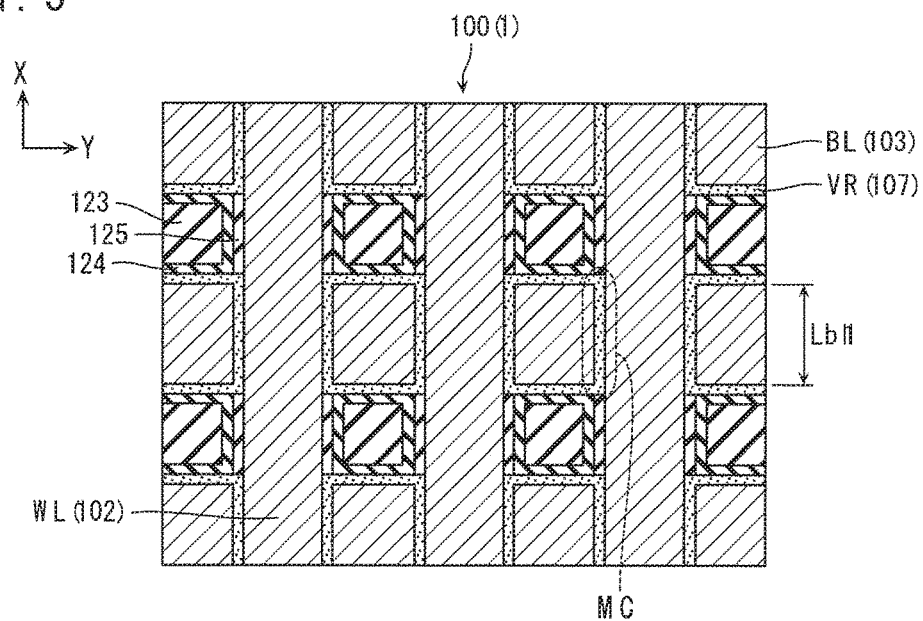

FIGS. 3 to 5 are views showing the structure of the memory cell array of the semiconductor memory device according to the present embodiment. FIG. 3 is a schematic perspective view of the memory cell array 1, and omits part of a configuration, such as an inter-layer insulating film between wiring lines. Moreover, FIG. 4 is a perspective view showing a portion more upward than the select transistor STR, of the memory cell array 100; and FIG. 5 is a cross-sectional view in X-Y directions of the memory cell array 100 at a position in a Z direction (height) of the word line WL.

As shown in FIG. 3, the memory cell array 1 has a so-called VBL (Vertical Bit Line) structure in which the bit line BL extends perpendicularly to a principal plane of a semiconductor substrate SS. In other words, the plurality of word lines WL are arranged in a matrix in the Y direction and the Z direction, and each extend in the X direction. The plurality of bit lines BL are arranged in a matrix in the X direction and the Y direction, and each extend in the Z direction. The variable resistance film VR included in each of the memory cells MC is disposed at each of the intersections of the plurality of word lines WL and the plurality of bit lines BL. The variable resistance films VR of the memory cells MC sharing one bit line BL are formed integrally so as to cover a side surface of this bit line BL. Note that the variable resistance film VR is not limited to the structure shown in FIGS. 3 to 5, and may have a structure of being isolated for each memory cell MC, for example. Now, the word line WL is formed by titanium nitride (TiN), for example. The bit line BL is formed by, for example, doped polysilicon (doped Poly-Si), tungsten nitride (WN), or a stacked body of tungsten nitride (WN) and tungsten (W). The variable resistance film VR is formed by a material whose resistance changes electrically. For example, the variable resistance film VR is formed by hafnium oxide ($HfO_2$), tantalum oxide ($TaO_2$), titanium oxide ($TiO_2$), zirconium oxide ($ZrO_2$), aluminum oxide ($Al_2O_3$), silicon oxide ($SiO_2$), or a stacked body of those.

Disposed between the semiconductor substrate SS and the plurality of bit lines BL are a plurality of the global bit lines GBL aligned in the X direction and extending in the Y direction. Moreover, respectively disposed at lower ends of the plurality of bit lines BL are the select transistors STR. These select transistors STR are controlled by a plurality of the select gates SG aligned in the Y direction and extending in the X direction. In the case of FIG. 3, while a plurality of the select transistors STR aligned in the X direction are controlled by one select gate SG, the select transistors STR aligned in the Y direction are controlled individually.

Next, a structure of in-between wiring lines of the memory cell array 100 will be described.

As shown in FIG. 4, in-between two word lines WL adjacent in the Z direction of the plurality of word lines WL is insulated by an inter-layer insulating film 121 disposed between these word lines WL. Now, the inter-layer insulating film 121 is formed by silicon oxide ($SiO_2$), for example. Note that an inter-layer insulating film 122 is disposed above the uppermost layer word line WL.

On the other hand, as shown in FIGS. 4 and 5, in-between two bit lines BL adjacent in the X direction of the plurality of bit lines BL is insulated by an insulating film 123 disposed between these bit lines BL. Furthermore, disposed between these bit lines BL, in addition to the insulating film 123, are two films 124 and 125. The film 124 is a film for preventing oxidation of a conductive film 102 acting as the word line WL in a formation process of the insulating film 123. Hereafter, this film 124 will be called an "antioxidizing film". On the other hand, the film 125 is a film for covering a void of a sacrifice film employed in formation of the bit line BL. Hereafter, this film 125 will be called a "void covering film". Now, the insulating film 123 is formed by silicon oxide ($SiO_2$), for example. The antioxidizing film 124 is formed by silicon nitride (SiN), for example. The void covering film 125 is formed by a material which is easily removed by wet etching or the like, and which is different from that of the antioxidizing film 124. For example, the void covering film 125 is formed by silicon oxide ($SiO_2$).

The insulating film 123 is a columnar body extending in the Z direction so as to follow the bit line BL. The antioxidizing film 124 is disposed so as to cover a bottom surface and side surface of the insulating film 123. An inside surface of the antioxidizing film 124 contacts the insulating film 123. An outside surface directed in the X direction of the antioxidizing film 124, in other words, a side surface facing the bit line BL of the antioxidizing film 124 contacts the variable resistance film VR. The void covering film 125 is disposed so as to cover a bottom surface and side surface directed in the Y direction of the antioxidizing film 124. An inside surface directed in the Y direction of the void covering film 125 contacts the antioxidizing film 124. An outside surface directed in the Y direction of the void covering film 125 contacts the word line WL. Therefore, regarding the X direction, the variable resistance film VR and the antioxidizing film 124 are disposed sequentially from the bit line BL to the insulating film 123; and regarding the Y direction, the void covering film 125 and the antioxidizing film 124 are disposed sequentially from the word line WL to the insulating film 123.

Next, a method of manufacturing the memory cell array 100 will be described.

FIGS. 6 to 28 are views explaining manufacturing steps of the memory cell array of the semiconductor memory device according to the present embodiment. FIGS. 6, 7, 9, 10, 12, 14, 16, 18-20, 22, 24, and 26 are perspective views showing a portion more upward than the select transistor STR, of the memory cell array 100; and FIGS. 8, 11, 13, 15, 17, 21, 23, 25, 27, and 28 are cross-sectional views in the X-Y directions of the memory cell array 100 at a position in the Z direction of the word line WL.

Figure 6:
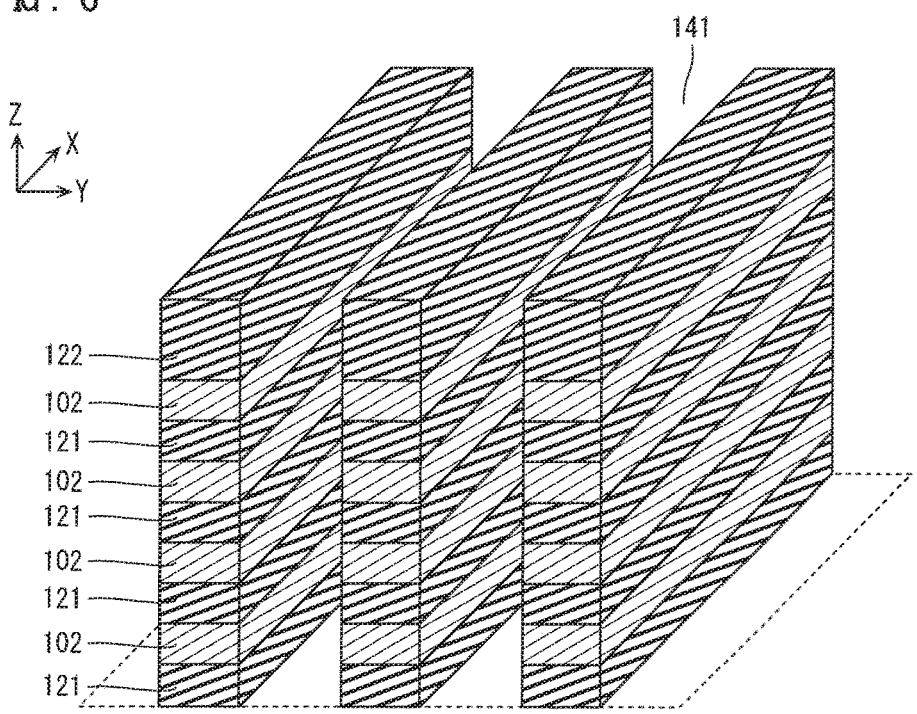
FIGS. 6 to 28 are views explaining manufacturing steps of the memory cell array of the semiconductor memory device according to the same embodiment.

First, the inter-layer insulating film 121 and the conductive film 102 are stacked alternately in the Z direction, as many times as desired, above the unillustrated semiconductor substrate SS. Next, the inter-layer insulating film 122 is deposited above the uppermost layer conductive film 102. Now, the conductive film 102 functions as the word line WL and is formed by titanium nitride (TiN), for example. The inter-layer insulating films 121 and 122 are formed by silicon oxide ($SiO_2$), for example. Next, a line-and-space (hereafter, notated as "L/S") pattern aligned in the Y direction is formed by lithography. Next, as shown in FIG. 6, a plurality of trenches 141 having the Z direction as their depth direction and having the X direction as their extension direction, are formed in at least from the lowermost layer inter-layer insulating film 121 to the inter-layer insulating film 122, by anisotropic etching using this pattern.

Figure 7:
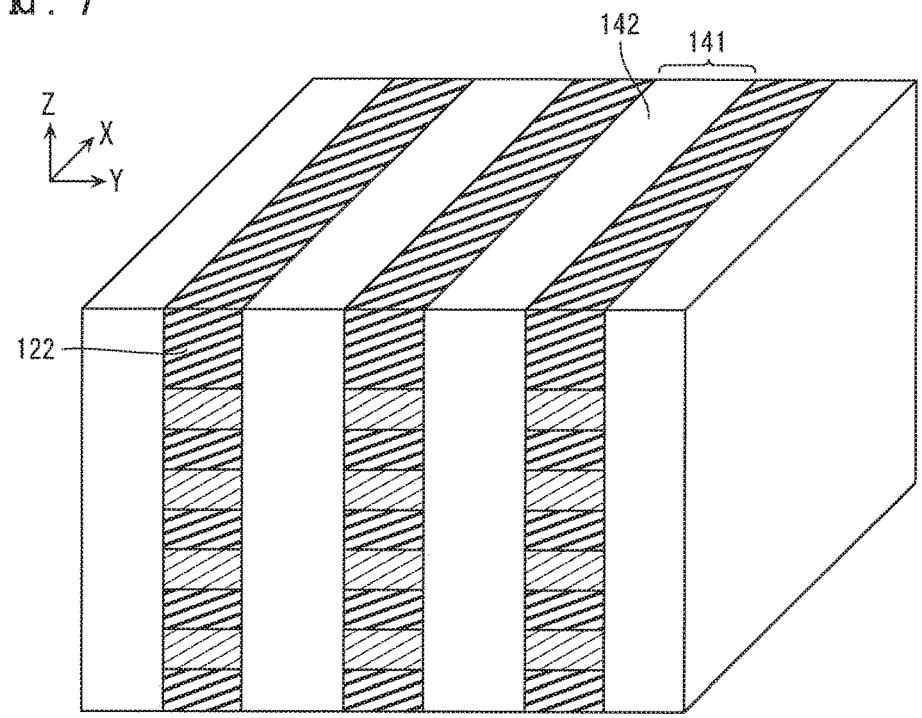
Figure 8:
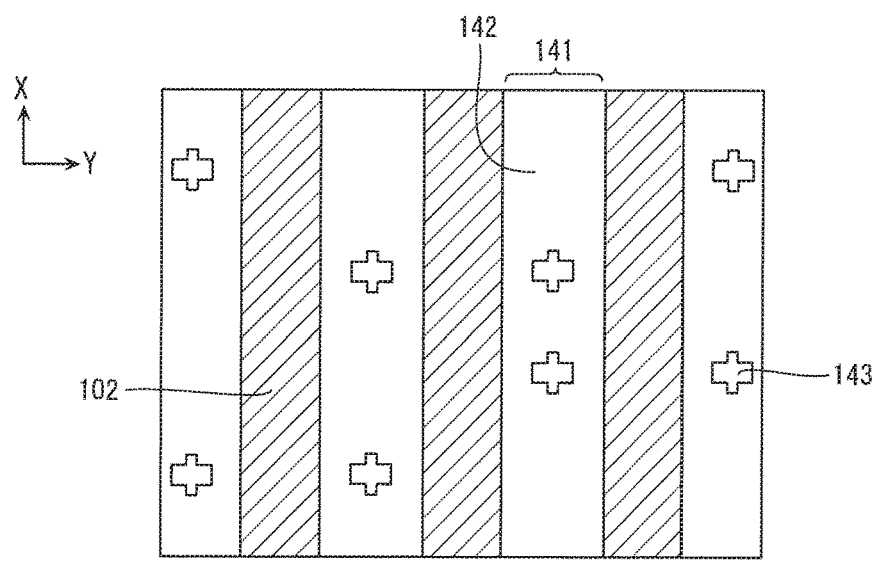

Next, as shown in FIG. 7, a sacrifice film 142 is implanted in the trench 141. Now, the sacrifice film 142 is formed by a material for which an etching processing selection ratio can be taken with respect to a material of a word line WL surface. For example, the sacrifice film 142 is formed by doped polysilicon (doped Poly-Si) or non-doped polysilicon (non-doped Poly-Si). Next, an upper part of the sacrifice film 142 is polished and planarized, by CMP (Chemical Mechanical Polishing), until an upper surface of the inter-layer insulating film 122 appears. Note that, as shown in FIG. 8, a void 143 may occur in places in the sacrifice film 142 deposited here.

Figure 9:
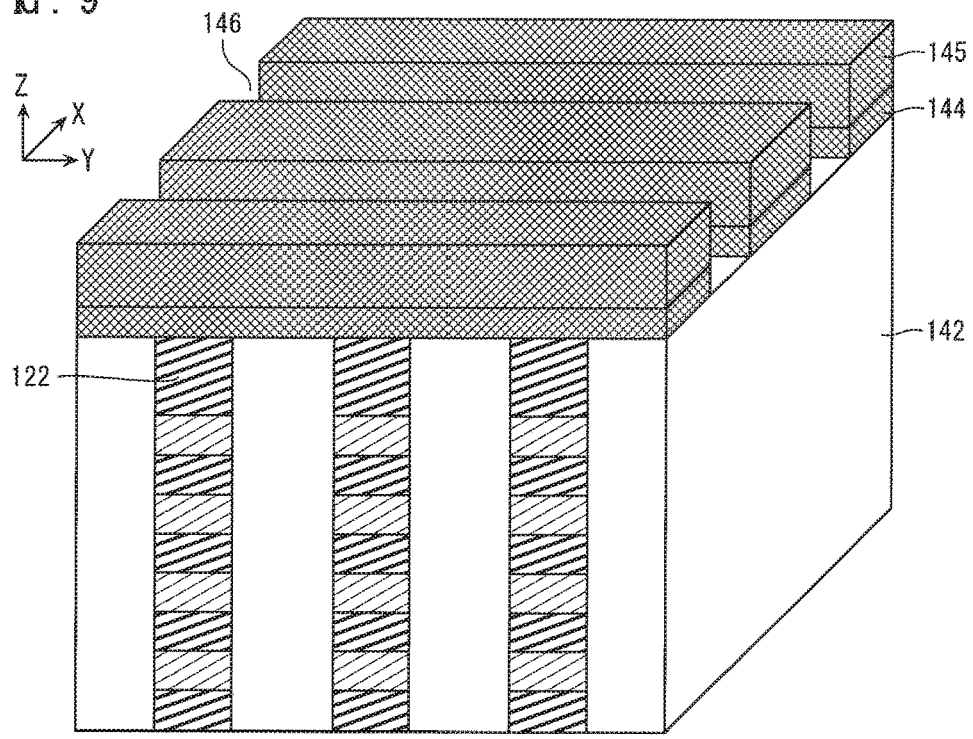

Next, a CMP stopper film 144 and an etching mask 145 employed in processing of a conductive film 103 in a later step, are deposited above the inter-layer insulating film 122 and the sacrifice film 142. Now, the CMP stopper film 144 is formed by silicon nitride (SiN), for example. The etching mask 145 is formed by silicon oxide (SiO$_2$), for example. Next, as shown in FIG. 9, a plurality of trenches 146 on whose bottom surfaces upper surfaces of the inter-layer insulating film 122 and the sacrifice film 142 are exposed and which have the Y direction as their extension direction, are formed in the CMP stopper film 144 and the etching mask 145, by lithography.

Figure 10:
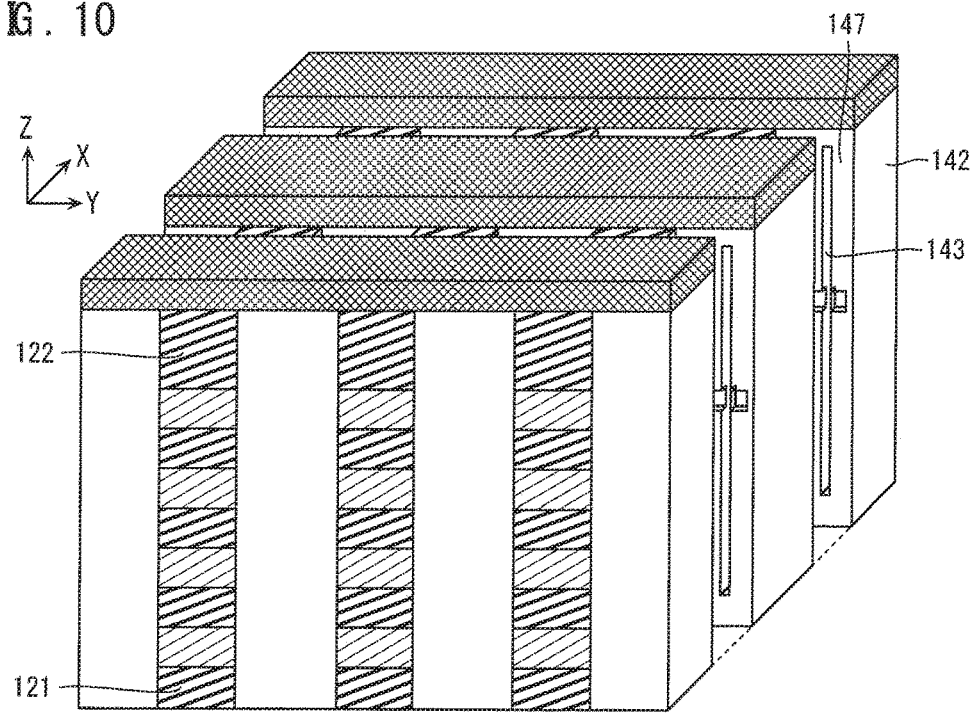
Figure 11:
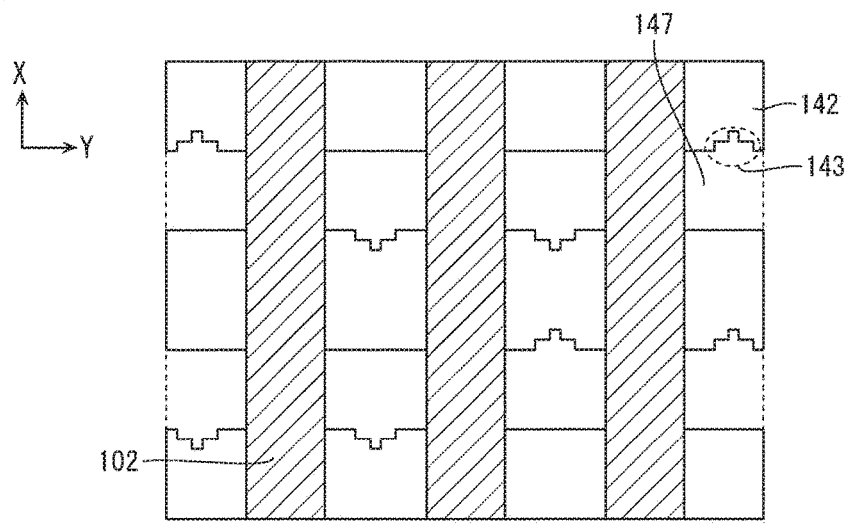

Next, as shown in FIGS. 10 and 11, a hole 147 reaching from an upper surface of the inter-layer insulating film 122 to a bottom surface of the lowermost layer inter-layer insulating film 121 is formed in the sacrifice film 142, by anisotropic etching using the etching mask 145. At this time, the etching mask 145 is removed. Moreover, the void 143 of the sacrifice film 142 is exposed in a side surface directed in the X direction of the hole 147.

Figure 12:
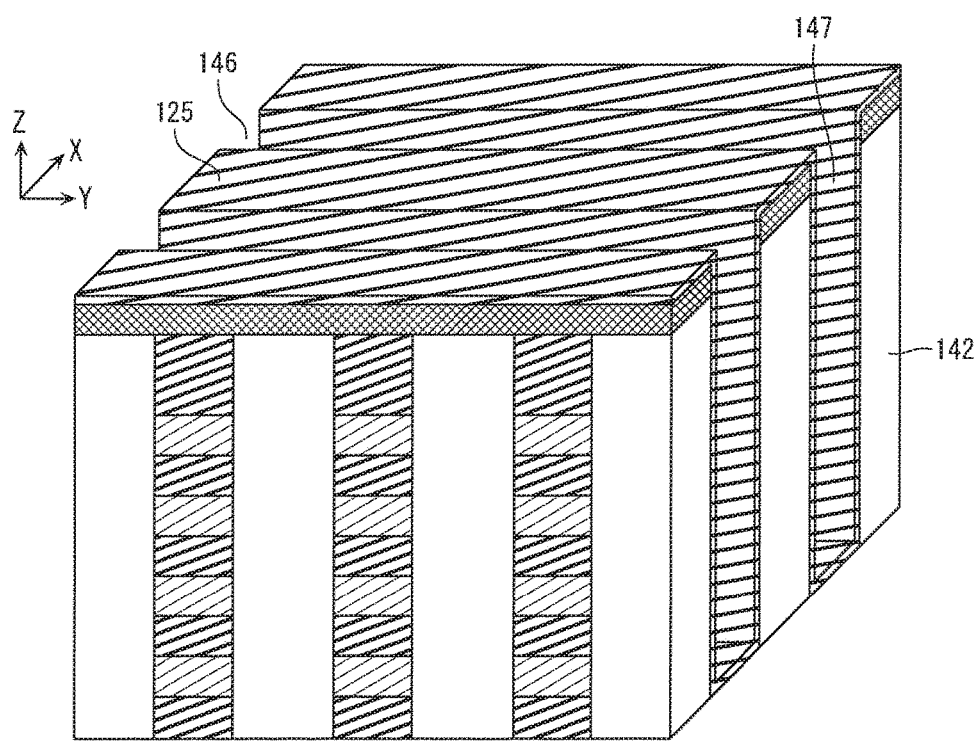
Figure 13:
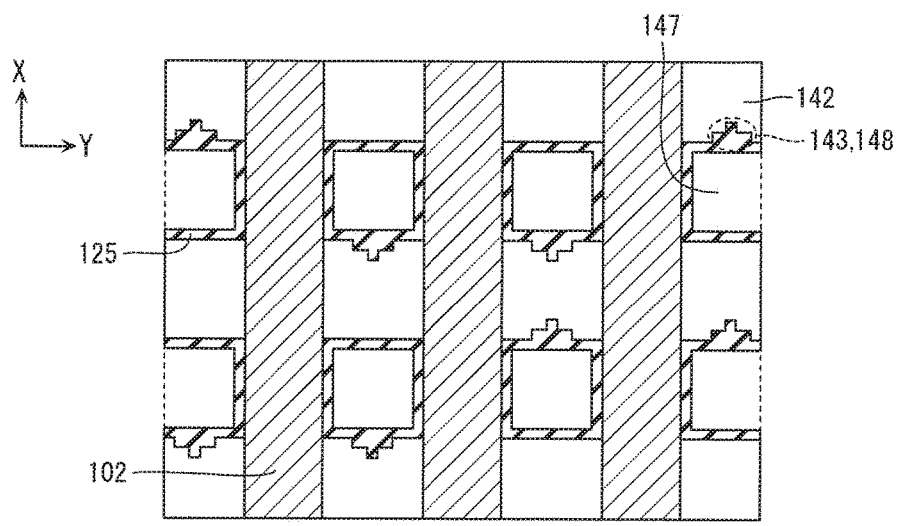

Next, as shown in FIGS. 12 and 13, the void covering film 125 is deposited on a side surface of the hole 147 by ALD (Atomic Layer Deposition), and the side surface directed in the X direction of the hole 147 is made flat. At this time, the void covering film 125 is filled into the void 143 of the sacrifice film 142. Hereafter, a portion within the void 143 of the void covering film 125 will be called a "projecting portion 148". Moreover, the void covering film 125 is deposited also on an upper surface and side surface of the trench 146 and on a bottom surface of the hole 147. Now, the void covering film 125 is formed by a material which is easily removed by wet etching or the like, and which is different from that of the antioxidizing film 124 deposited in a later step. For example, the void covering film 125 is formed by silicon oxide (SiO$_2$).

Figure 14:
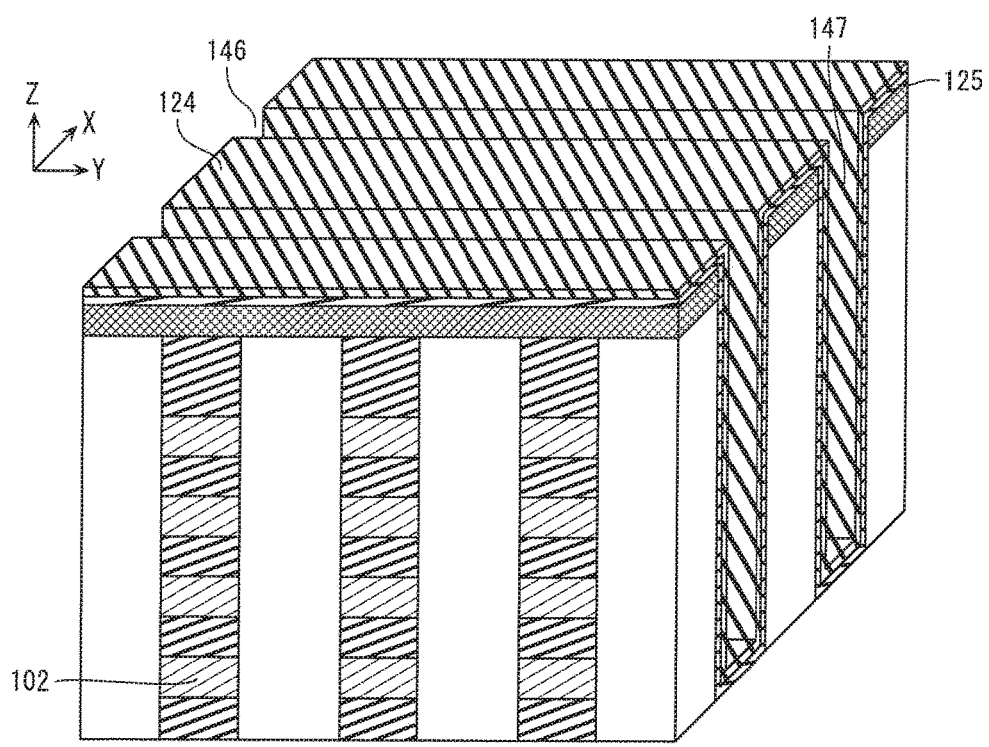
Figure 15:
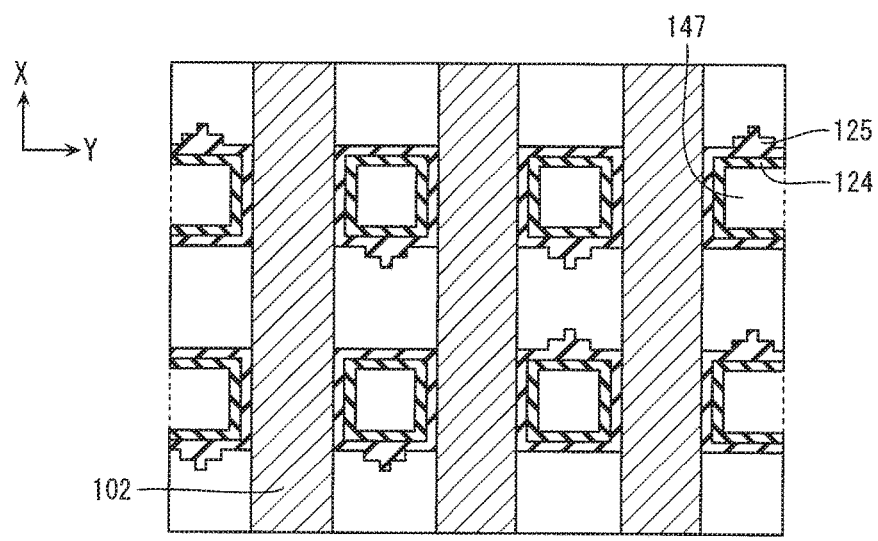

Next, as shown in FIGS. 14 and 15, the antioxidizing film 124 is deposited, by ALD, on the side surface of the hole 147 where the void covering film 125 has been deposited. At this time, the antioxidizing film 124 is deposited also on the side surface of the trench 146 and on the bottom surface of the hole 147. Now, the antioxidizing film 124 is formed by silicon nitride (SiN), for example.

Figure 16:
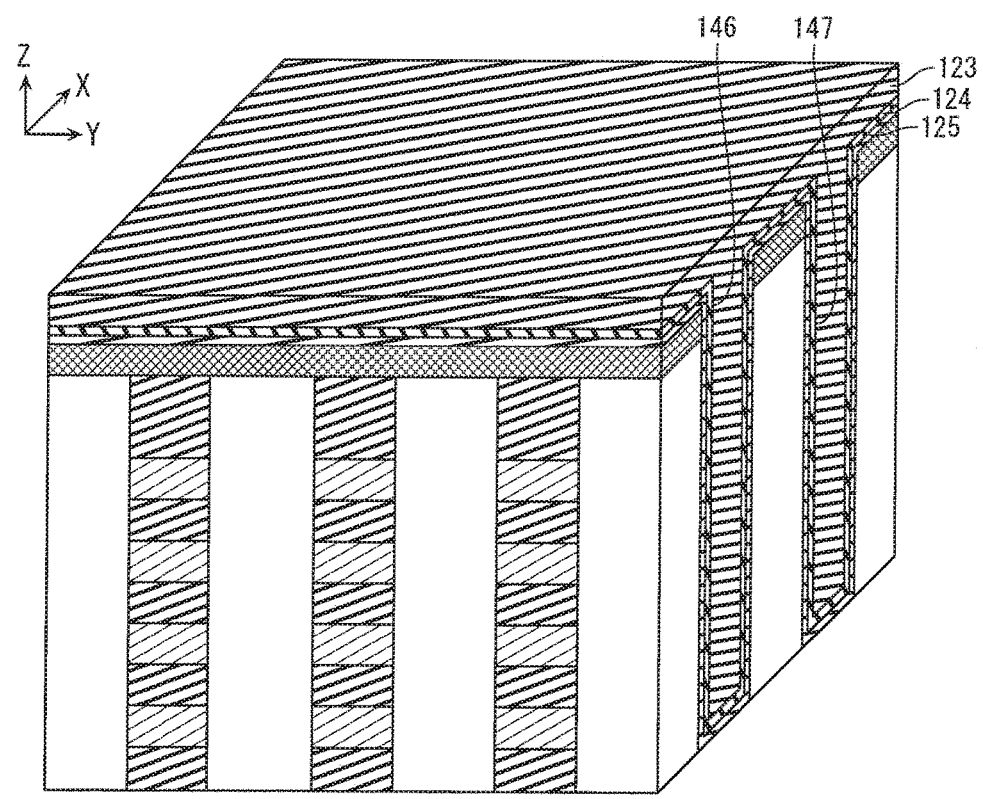
Figure 17:
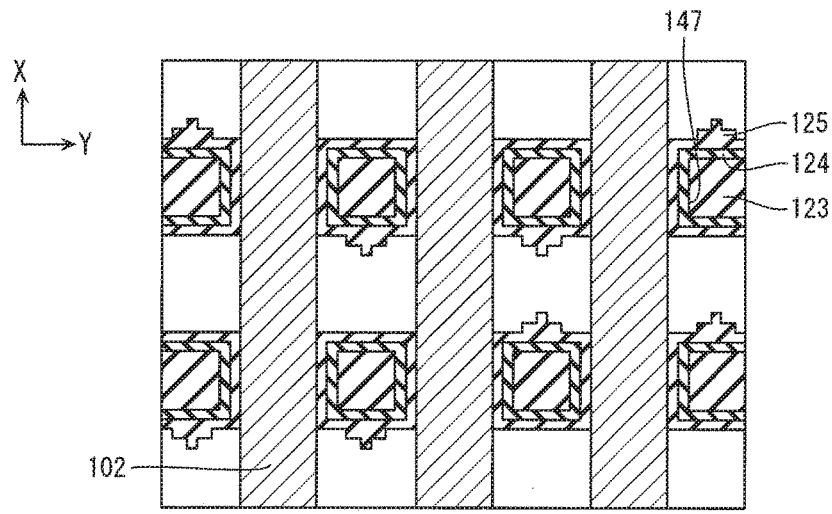

Next, as shown in FIGS. 16 and 17, the insulating film 123 is implanted in the trench 146 and the hole 147. Now, the insulating film 123 is formed by silicon oxide (SiO$_2$), for example.

Figure 18:
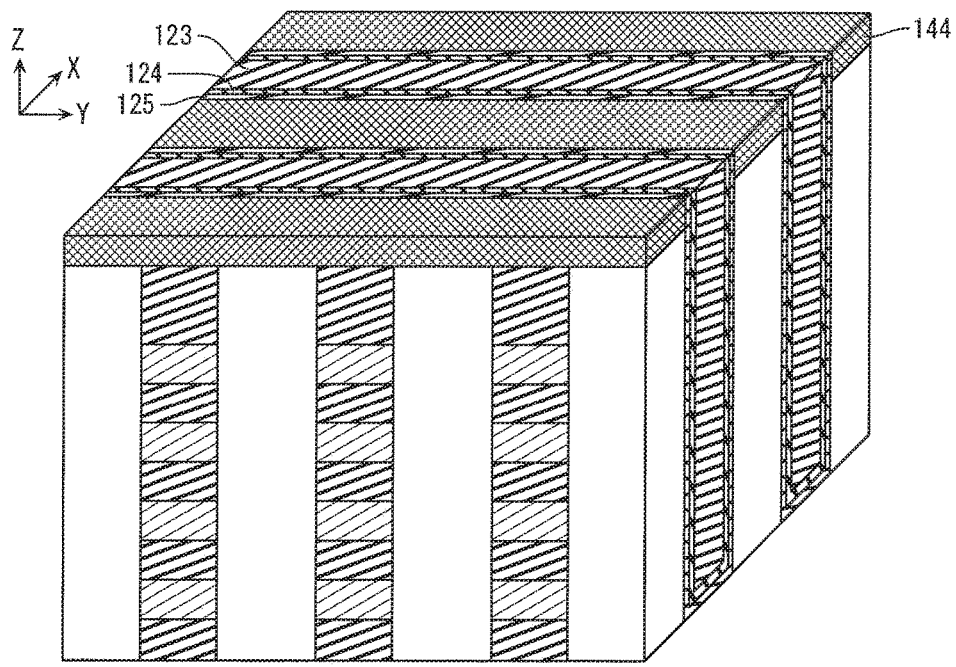

Next, as shown in FIG. 18, upper parts of the insulating film 123, the antioxidizing film 124, and the void covering film 125 are polished and planarized by CMP, until an upper surface of the CMP stopper film 144 appears.

Figure 19:
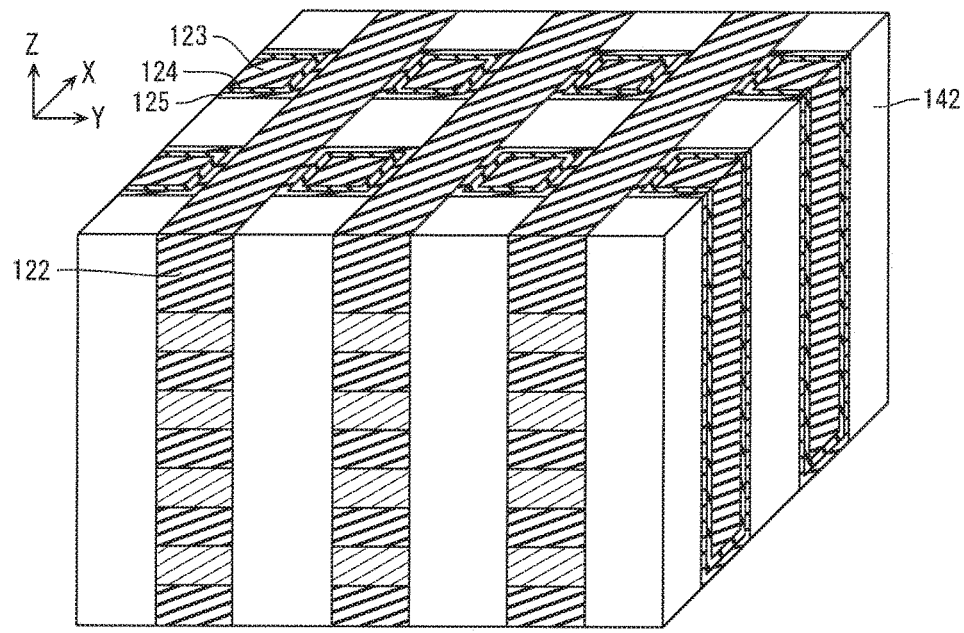

Next, as shown in FIG. 19, the CMP stopper film 144 and upper parts of the insulating film 123, the antioxidizing film 124, and the void covering film 125 are removed until upper surfaces of the inter-layer insulating film 122 and the sacrifice film 142 appear.

Figure 20:
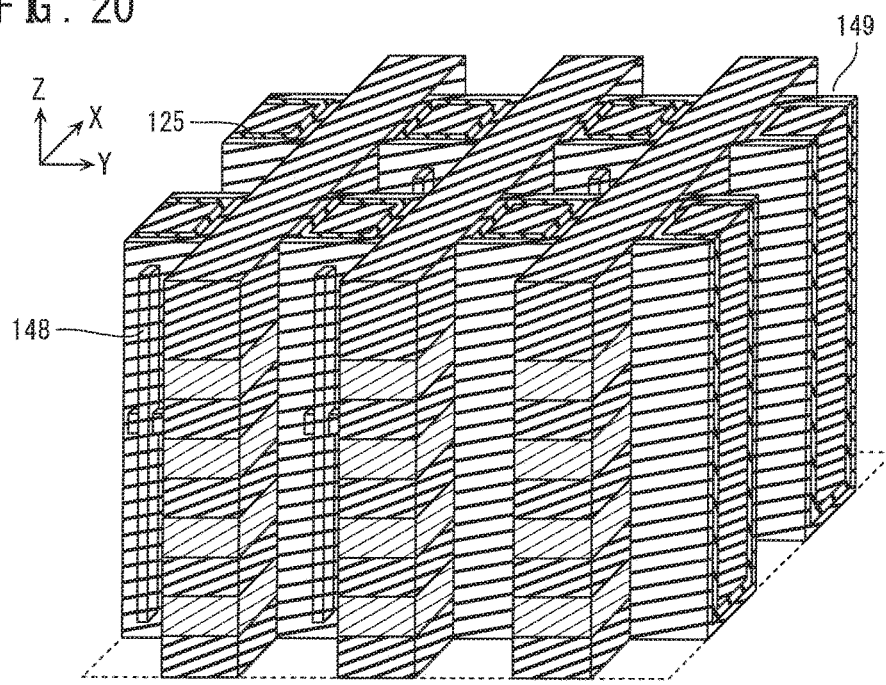
Figure 21:
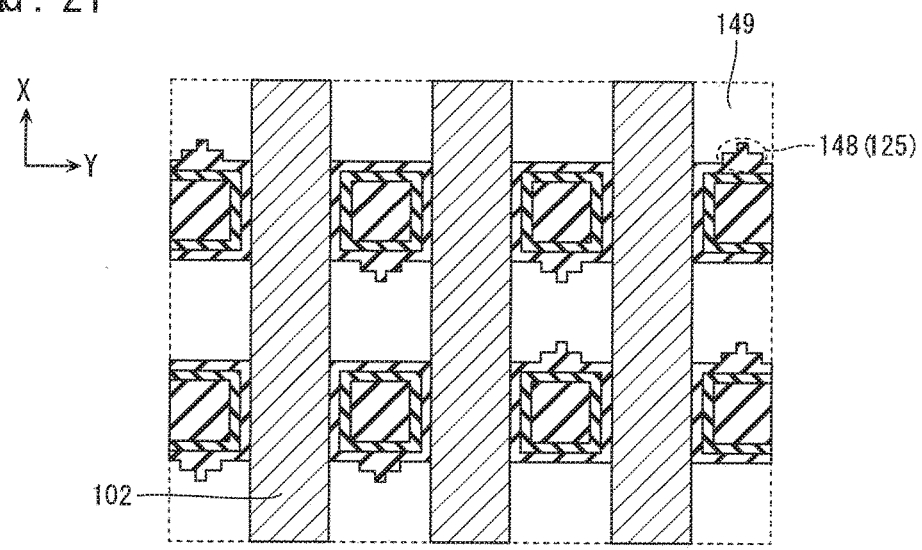

Next, as shown in FIGS. 20 and 21, the sacrifice film 142 is removed and a hole 149 is formed, by wet etching. At this time, the projecting portion 148 projecting in the X direction appears in the hole 149 as part of the void covering film 125.

Figure 22:
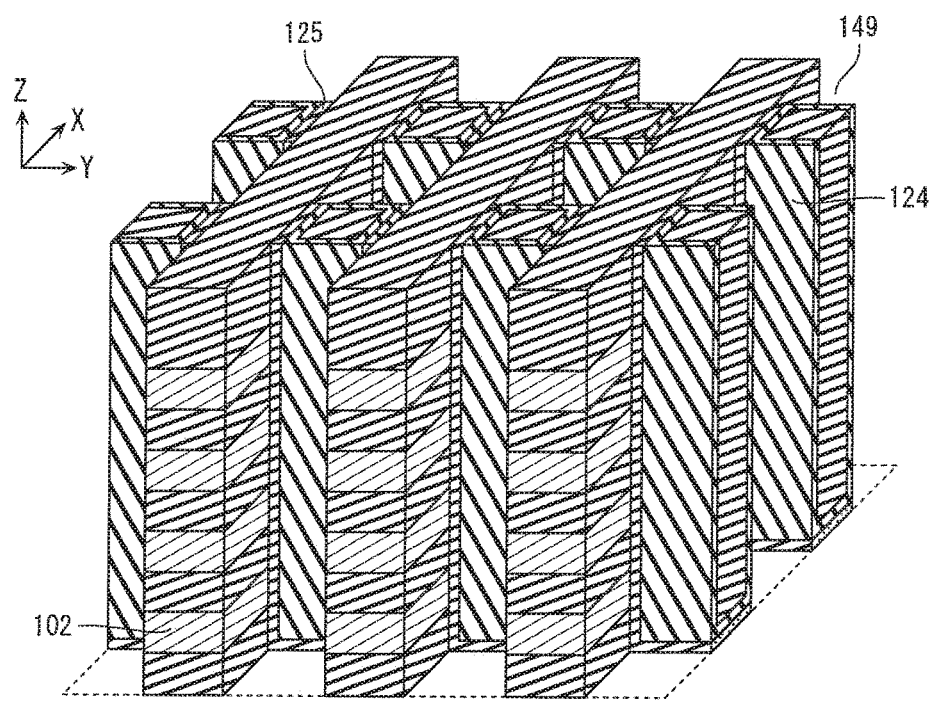
Figure 23:
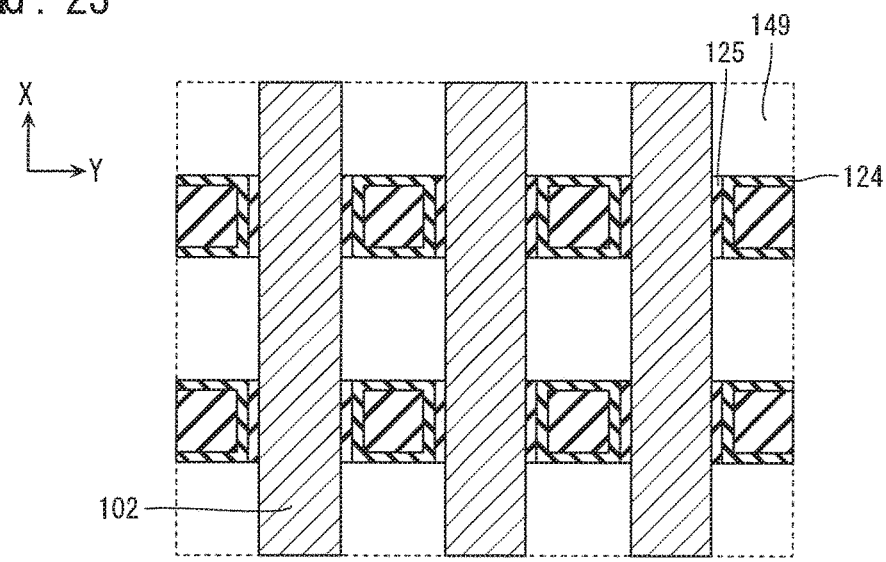

Next, as shown in FIGS. 22 and 23, a portion appearing on a side surface of the hole 149, of the void covering film 125 is removed. As a result, the projecting portion 148 is also removed, and a flat outside surface of the antioxidizing film 124 appears on a side surface directed in the X direction of the hole 149. Note that even after this step, a portion between the conductive film 102 and the antioxidizing film 124, of the void covering film 125 remains.

Figure 24:
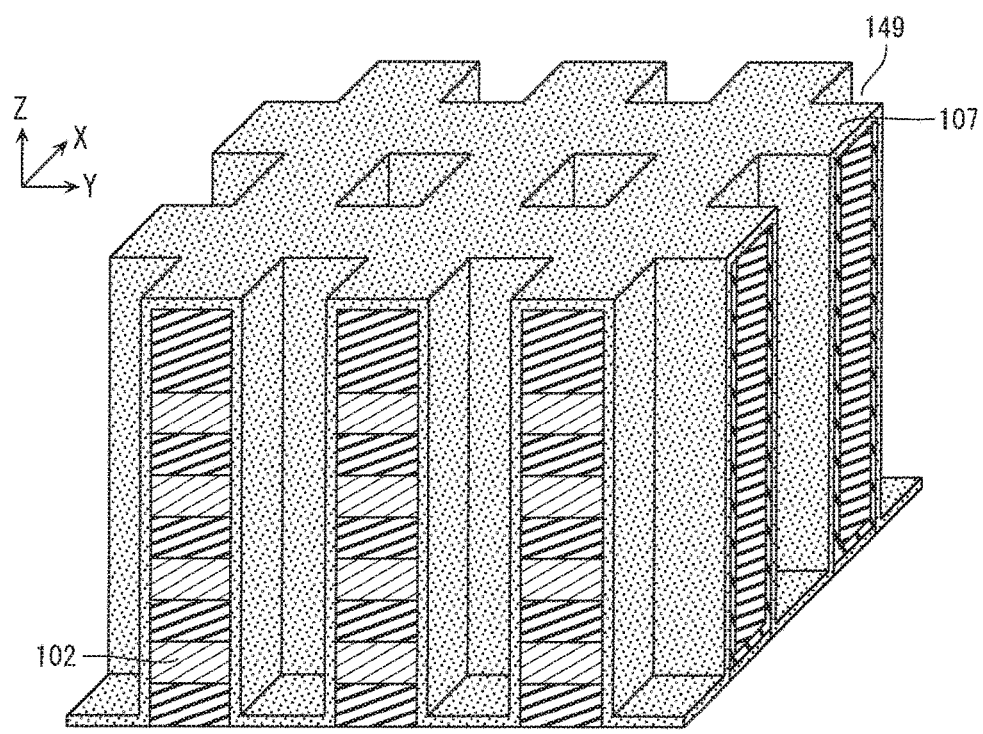
Figure 25:
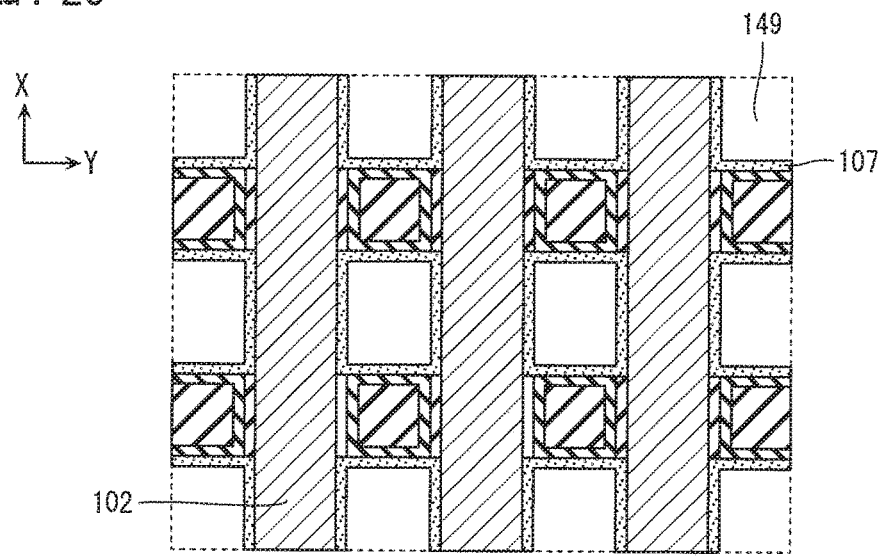

Next, as shown in FIGS. 24 and 25, a variable resistance film 107 having a desired film thickness is deposited on a side surface directed in the Y direction of the hole 149, in other words, on a side surface of the conductive film 102. At this time, the variable resistance film 107 is deposited also on a bottom surface of the hole 149 and on a side surface directed in the X direction of the hole 149. Now, the variable resistance film 107 functions as the variable resistance film VR, and is formed by, for example, hafnium oxide (HfO$_2$), tantalum oxide (TaO$_2$), titanium oxide (TiO$_2$), zirconium oxide (ZrO$_2$), aluminum oxide (Al$_2$O$_3$), silicon oxide (SiO$_2$), or a stacked body of those.

Figure 26:
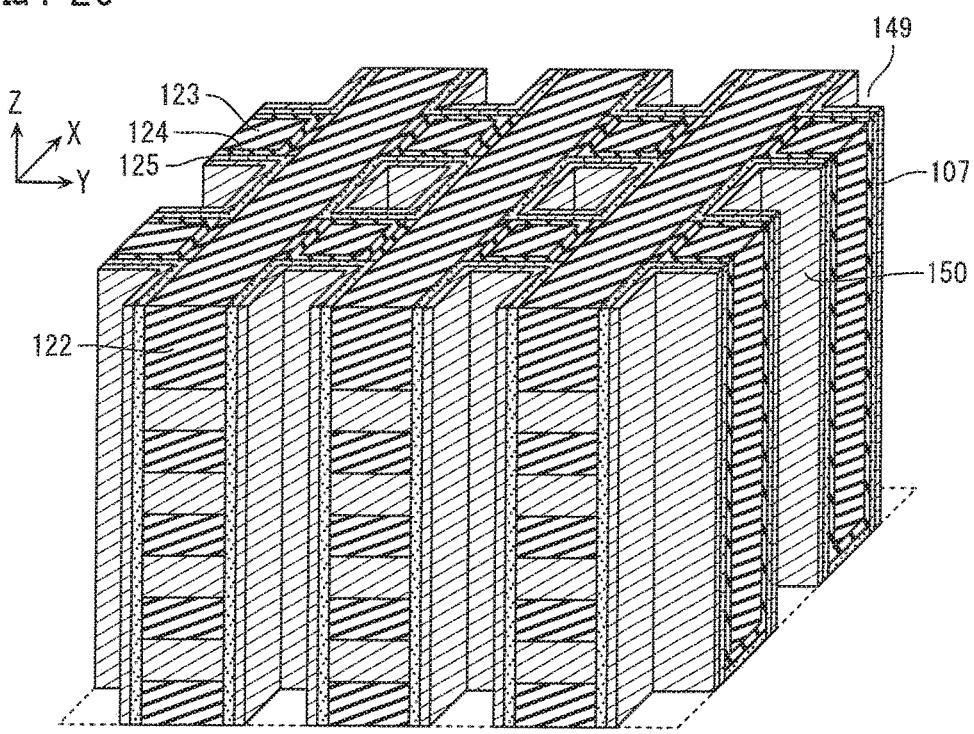
Figure 27:
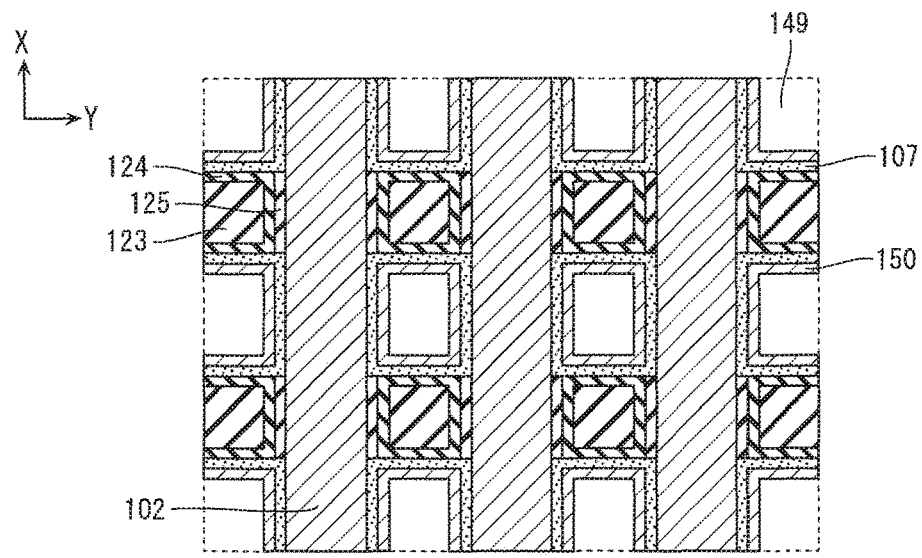
Figure 28:
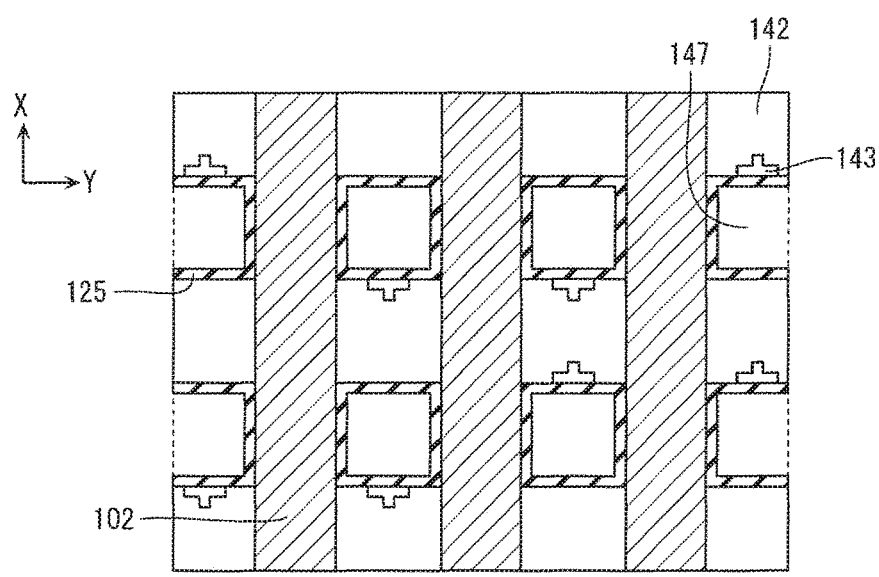

Next, a processing protective film 150 covering a surface of the variable resistance film 107 is deposited. Now, the processing protective film 150 is a film for protecting the variable resistance film 107 in a later step, and is formed by, for example, doped polysilicon (doped Poly-Si) or silicon nitride (SiN). Next, as shown in FIGS. 26 and 27, portions in a bottom part of the hole 149 of the variable resistance film 107 and the processing protective film 150 are removed by anisotropic etching. As a result, electrical conduction between the bit line BL disposed in the hole 149 in a later step and the select transistor STR, is secured. In addition, at this time, upper parts of the variable resistance film 107 and the processing protective film 150 are removed, and upper surfaces of the inter-layer insulating film 122, the insulating film 123, the antioxidizing film 124, and the void covering film 125 appear.

Next, the processing protective film 150 is removed. Note that when the processing protective film 150 has conductivity and can be utilized as part of the bit line BL, this step may be omitted. Next, the conductive film 103 is implanted in the hole 149. Now, the conductive film 103 functions as the bit line BL, and is formed by, for example, doped polysilicon (doped Poly-Si), tungsten nitride (WN), or a stacked body of tungsten nitride (WN) and tungsten (W). Finally, when an upper part of the conductive film 103 is planarized, the memory cell array 100 having the structure shown in FIGS. 5 and 6 is formed.

That concludes the manufacturing steps of the memory cell array 100.

Note that in the case of the above description, the void covering film 125 is filled into the entire void 143, but the present embodiment is not limited to this. In other words, this void covering film 125 is a film having an object of preventing penetration of the antioxidizing film 124 into the void 143. Therefore, as shown in FIG. 14, it is only required that at least a cover can be made in an opening of the void 143 by the void covering film 125, and it is not necessarily required that the projecting portion 148 is formed.

Next, advantages of the structure of the memory cell array 100 and the manufacturing steps thereof will be described using a memory cell array 300 of a comparative example. Now, the memory cell array 300 of the comparative example has a structure in which the void covering film 125 is removed from the memory cell array 100 of the present embodiment.

As previously mentioned, when the sacrifice film 142 is implanted in the trench 141, the void 143 sometimes occurs within the sacrifice film 142 as shown in FIG. 8. In this case, as shown in FIGS. 20 and 21, the projecting portion 148 projecting in the X direction appears in the hole 149. Now, if, in a state unchanged from that, the variable resistance film 107 is deposited and the conductive film 103 implanted in the hole 149, then the conductive film 103 ends up becoming thinner by an amount of the projecting portion 148, and the bit line BL locally attains a high resistance whereby variation ends up occurring in a resistance distribution. As a result, it becomes a problem that desired characteristics as the memory cell array 1 become unobtainable, and yield lowers.

In order to solve this problem, it is only required that after formation of the hole 149, the projecting portion 148 that has appeared therein is removed. However, when there is no void covering film 125 as in the memory cell array 300 of the comparative example, the projecting portion 148 ends up being formed as part of the antioxidizing film 124. Moreover, the antioxidizing film 124 is formed by the likes of silicon nitride (SiN) whose removal is comparatively difficult. Therefore, in the case of the memory cell array 300, removal of the projecting portion 148 in that manufacturing step becomes comparatively difficult.

In that respect, in the case of the present embodiment, the void covering film 125 is deposited before deposition of the antioxidizing film 124, whereby penetration of the antioxidizing film 124 to inside the void 143 is prevented and the side surface directed in the X direction of the hole 147 is made flat. Furthermore, the projecting portion 148 is formed as part of the void covering film 125 which is configured from an easily-etched material, hence subsequent removal of the projecting portion 148 can be performed comparatively easily. As a result, local thinning of the bit line BL ceases, and a uniform resistance distribution can be achieved.

As described above, due to the present embodiment, variation in resistance distribution of the bit line is suppressed. This makes it possible to provide a semiconductor memory device in which a desired voltage can be applied to the variable resistance film whereby switching characteristics of the variable resistance film improve, and to provide a method of manufacturing the semiconductor memory device.

Second Embodiment

In a second embodiment, mainly points different from in the first embodiment will be described.

Hereafter, the memory cell array 1 of the present embodiment will sometimes also be shown assigned with a reference symbol 200 in order to distinguish it from a memory cell array 1 of another embodiment and a comparative example. Moreover, in the description of the present embodiment, reference symbols corresponding to those used in the description of the first embodiment will continue to be used unchanged.

First, a structure of the memory cell array 200 will be described.

Figure 29:
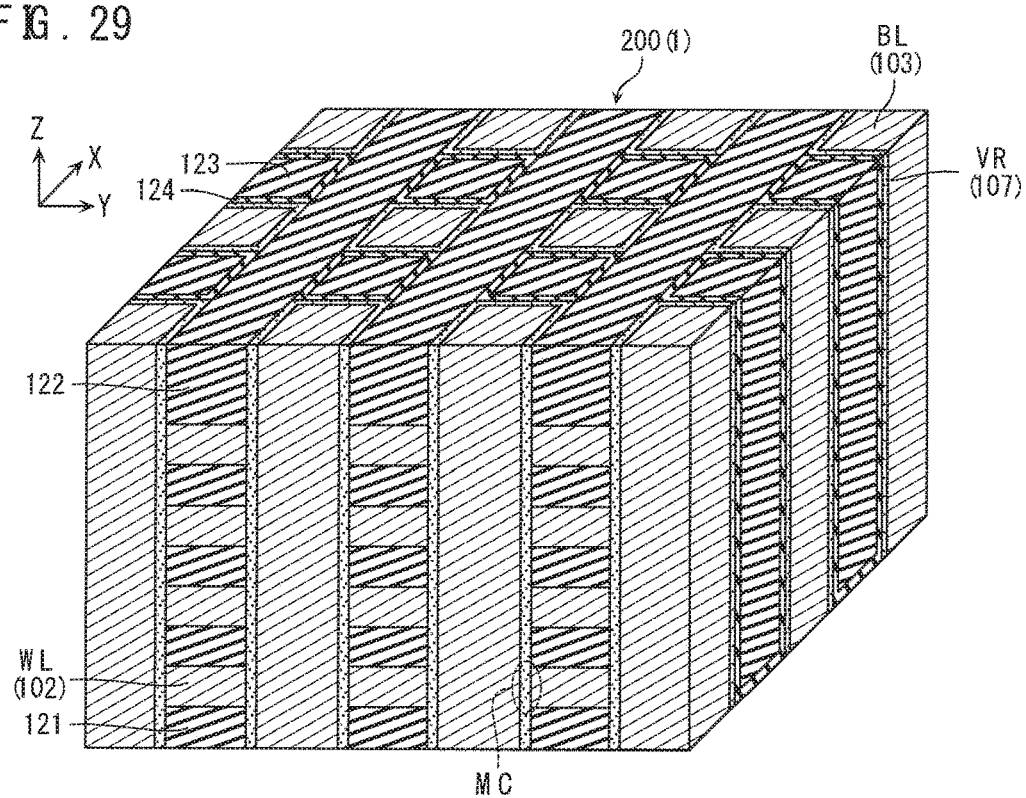
FIGS. 29 and 30 are views showing a structure of a memory cell array of a semiconductor memory device according to a second embodiment.
Figure 30:
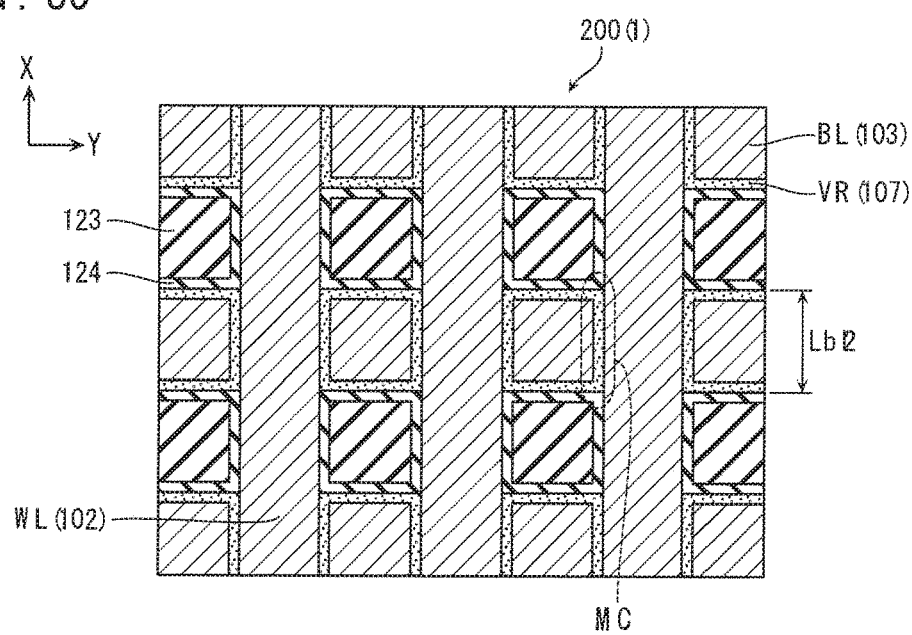

FIGS. 29 and 30 are views showing the structure of the memory cell array of a semiconductor memory device according to the present embodiment. FIG. 29 is a perspective view showing a portion more upward than the select transistor STR, of the memory cell array 200; and FIG. 30 is a cross-sectional view in the X-Y directions of the memory cell array 200 at a position in the Z direction (height) of the word line WL.

In the memory cell array 100 of the first embodiment, three films, that is, the insulating film 123, the antioxidizing film 124, and the void covering film 125 were disposed between two bit lines adjacent in the X direction of the plurality of bit lines BL. In contrast, as shown in FIGS. 29 and 30, the memory cell array 200 of the present embodiment, similarly to the memory cell array 300 of the comparative example, has a structure not having the void covering film 125. In other words, in the case of the memory cell array 200, contrary to in the memory cell array 100, only the antioxidizing film 124 is disposed between the word line WL and the insulating film 123.

Next, a method of manufacturing the memory cell array 200 will be described.

FIGS. 31 to 41 are views explaining manufacturing steps of the memory cell array of the semiconductor memory device according to the present embodiment. FIGS. 31, 33, 35, 37, and 39 are perspective views showing a portion more upward than the select transistor STR, of the memory cell array 200; and FIGS. 32, 34, 36, 38, 40, and 41 are cross-sectional views in the X-Y directions of the memory cell array 200 at a position in the Z direction of the word line WL.

First, steps similar to the steps shown in FIGS. 6 to 13 are implemented, from stacking of the inter-layer insulating film 121 and the conductive film 102 to deposition of the void covering film 125. Now, the void covering film 125 is formed by a material which is easily removed by wet etching or the like, and which is different from that of the antioxidizing film 124 deposited in a later step. For example, the void covering film 125 is formed by silicon oxide ($SiO_2$).

Figure 31:
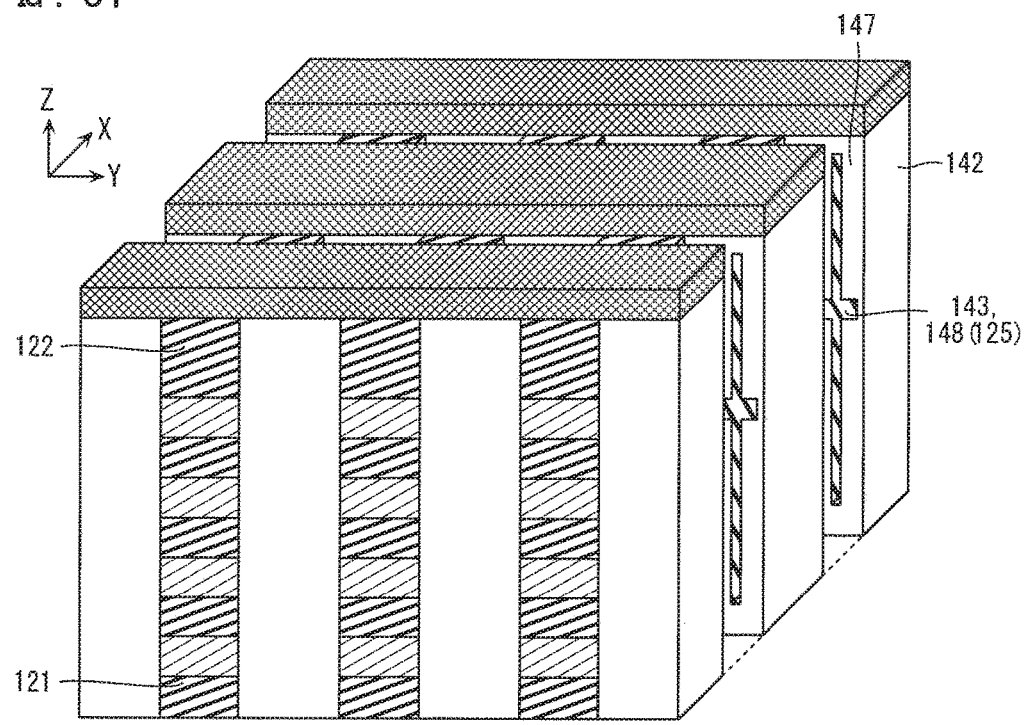
FIGS. 31 to 41 are views explaining manufacturing steps of the memory cell array of the semiconductor memory device according to the same embodiment.
Figure 32:
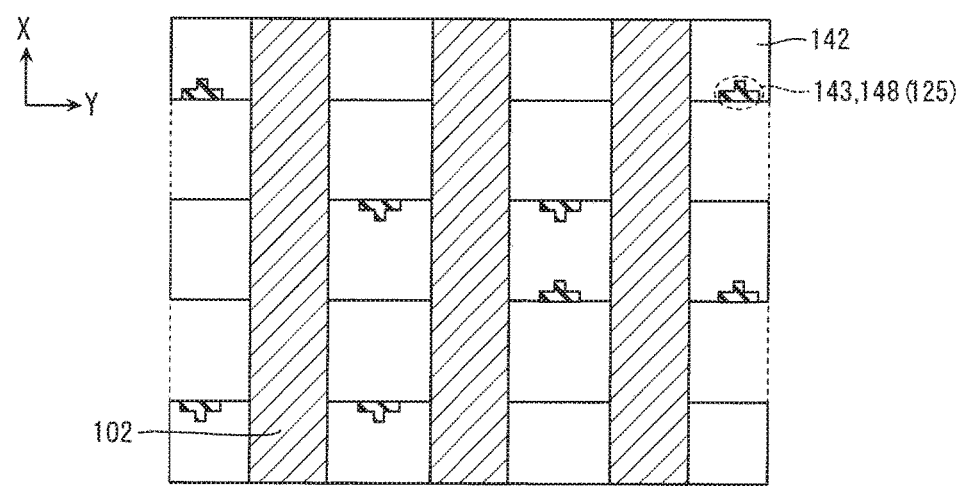

Next, as shown in FIGS. 31 and 32, the void covering film 125, excluding the projecting portion 148 within the void 143, is removed by wet etching. As a result, the void 143 remains implanted with the protruding portion 148, hence a side surface directed in the X direction of the hole 147 is flat. Note that contrary to in the first embodiment, the void covering film 125 is not left on a side surface directed in the Y direction of the hole 147.

Figure 33:
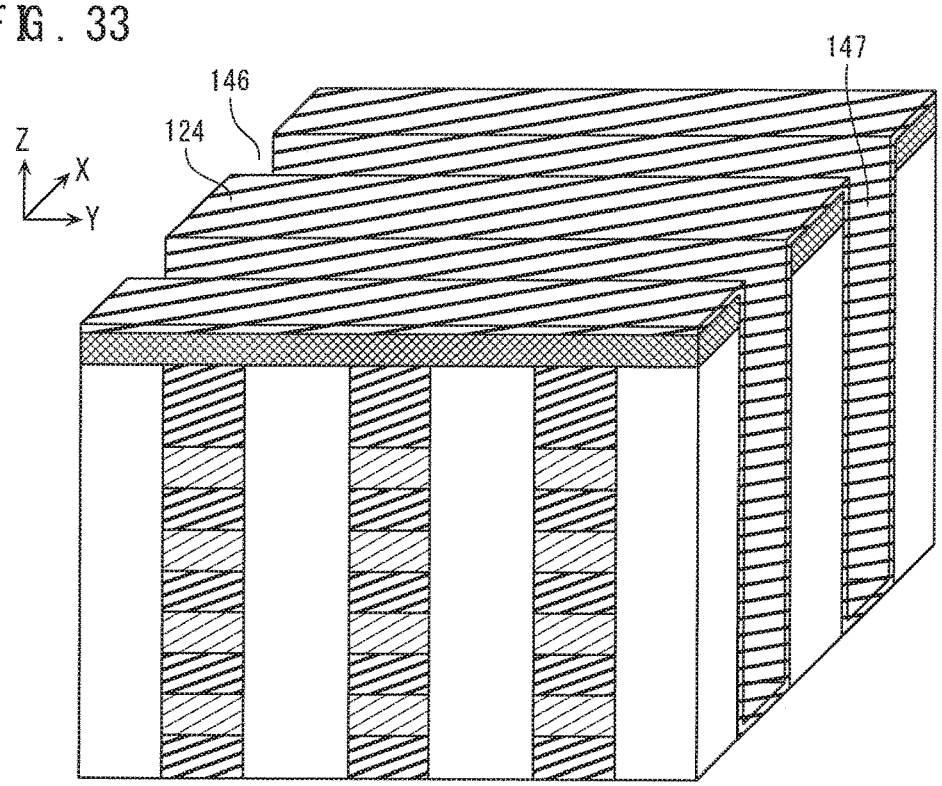
Figure 34:
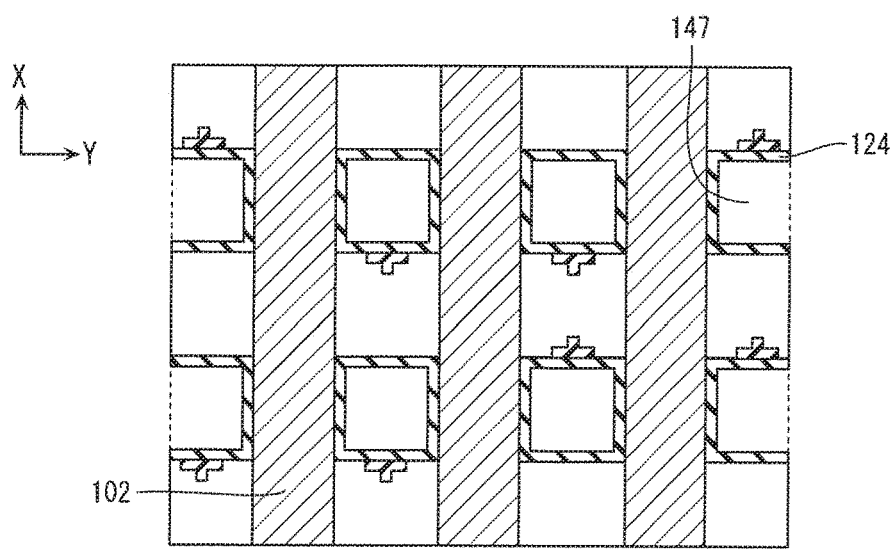

Next, as shown in FIGS. 33 and 34, the antioxidizing film 124 is deposited on the side surface of the hole 147 by ALD. At this time, the antioxidizing film 124 is deposited also on the side surface of the trench 146 and on the bottom surface of the hole 147. Now, the antioxidizing film 124 is formed by silicon nitride (SiN), for example.

Figure 35:
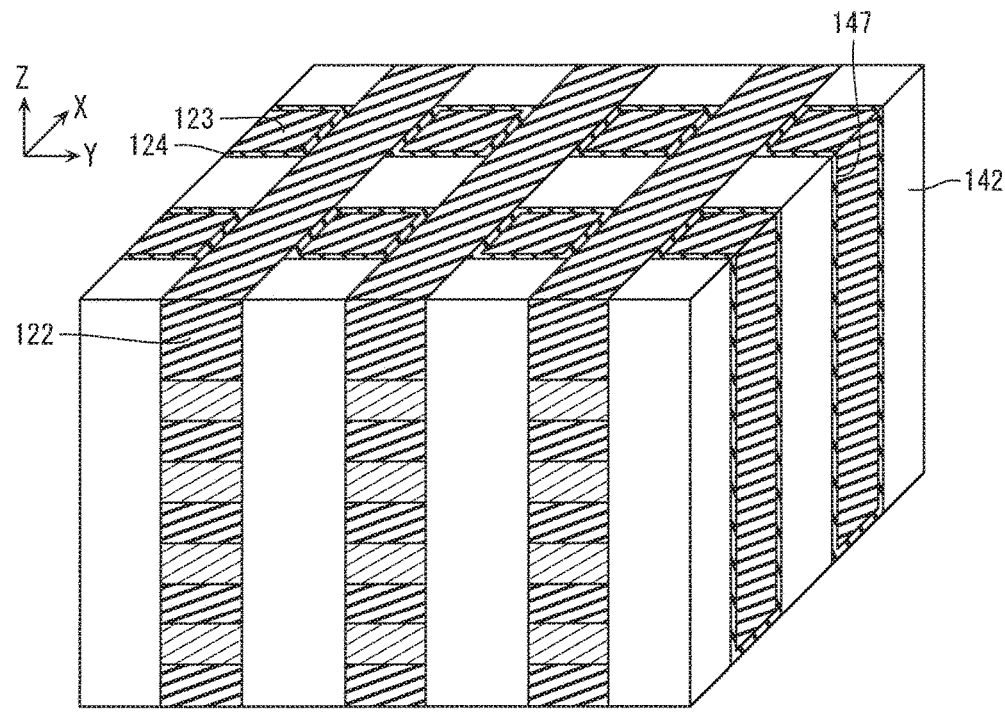
Figure 36:
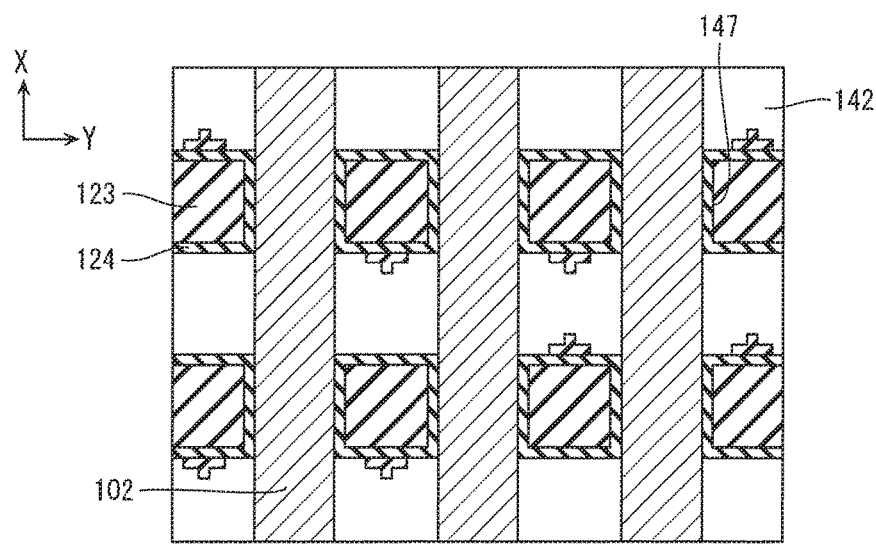

Next, the insulating film 123 is implanted in the trench 146 and the hole 147. Now, the insulating film 123 is formed by silicon oxide ($SiO_2$), for example. Next, upper parts of the insulating film 123 and the antioxidizing film 124 are polished and planarized by CMP, until an upper surface of the CMP stopper film 144 appears. Next, as shown in FIGS. 35 and 36, the CMP stopper film 144 and upper parts of the insulating film 123 and the antioxidizing film 124 are removed until upper surfaces of the inter-layer insulating film 122 and the sacrifice film 142 appear.

Figure 37:
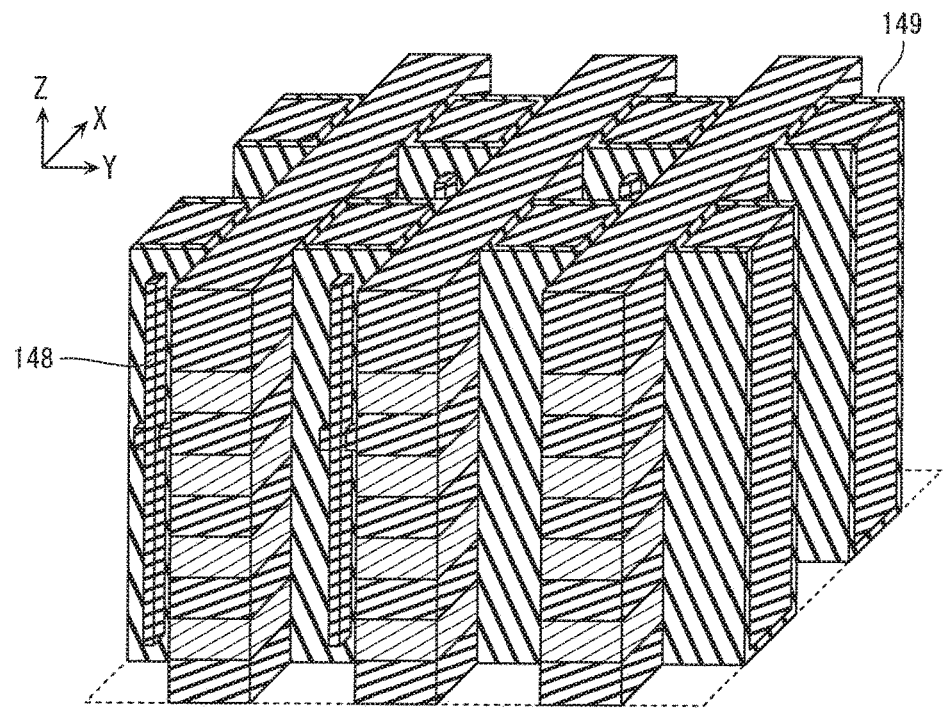
Figure 38:
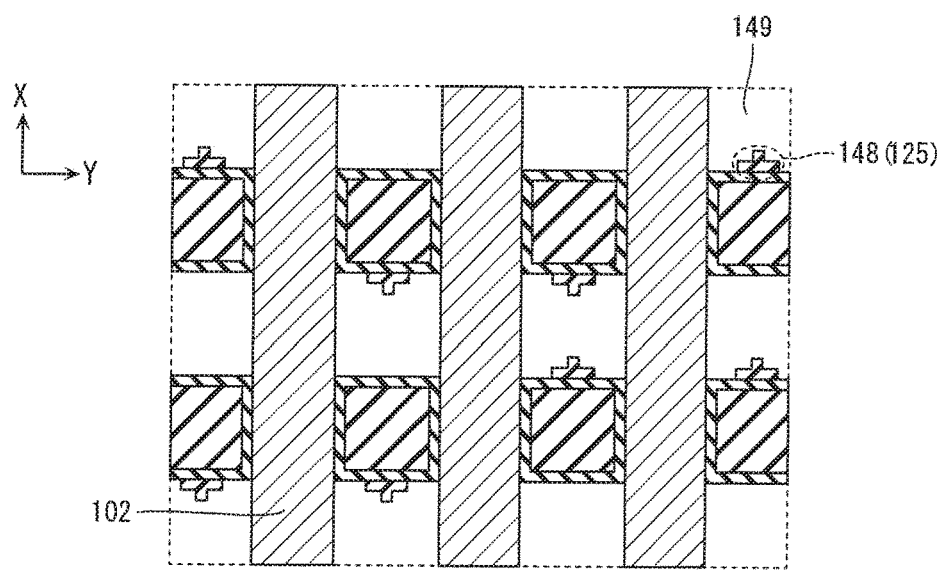

Next, as shown in FIGS. 37 and 38, the sacrifice film 142 is removed and the hole 149 is formed, by wet etching. At this time, the projecting portion 148 of the void covering film 125 appears in the hole 149.

Figure 39:
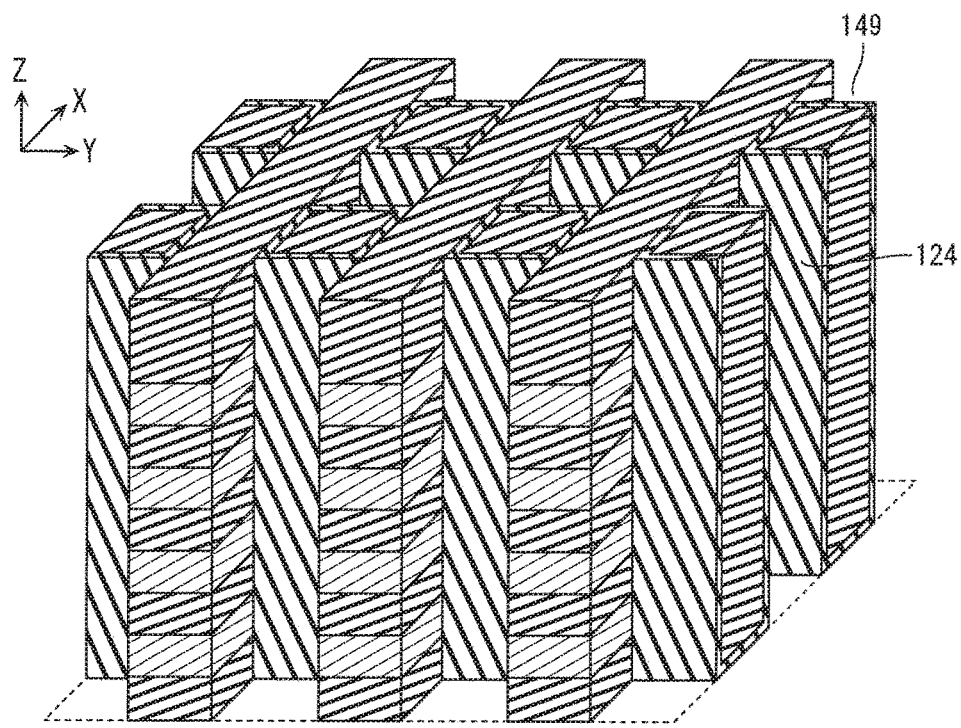
Figure 40:
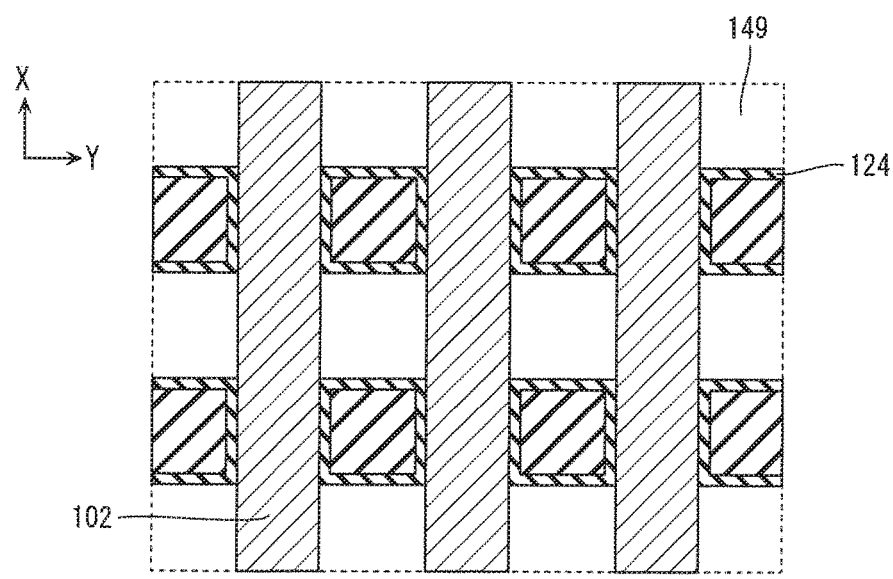
Figure 41:
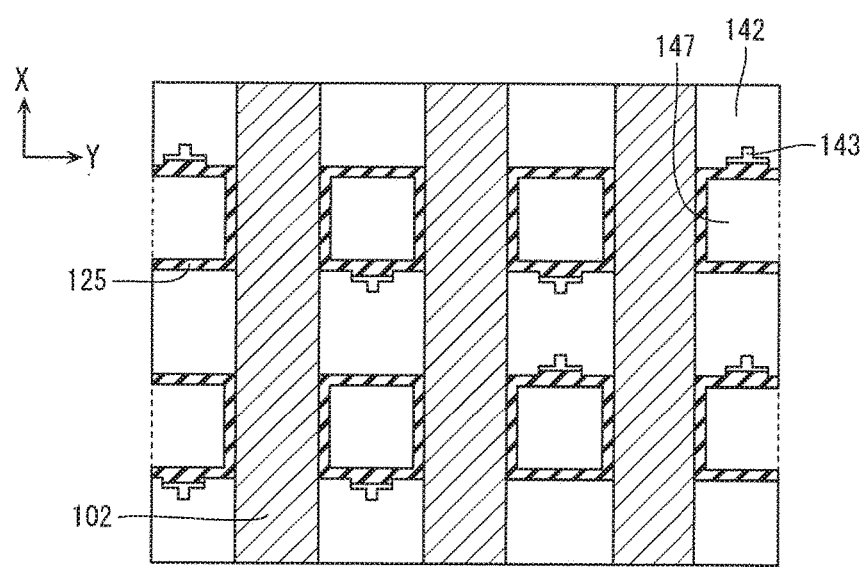

Next, as shown in FIGS. 39 and 40, the projecting portion 148 of the void covering film 125 is removed. As a result, a flat outside surface of the antioxidizing film 124 appears on a side surface directed in the X direction of the hole 149.

Subsequently, steps similar to the steps shown in FIGS. 24 to 27 are implemented, whereby the memory cell array 200 having the structure shown in FIGS. 29 and 30 is formed.

That concludes the manufacturing steps of the memory cell array 200.

Note that in the above description, the void covering film 125 is filled into the entire void 143, but the present embodiment is not limited to this. In other words, the void covering film 125 is a film having an object of disposing the projecting portion 148 that prevents penetration of the antioxidizing film 124 into the void 143. Therefore, it is sufficient for the opening of the void 143 to be blocked by the projecting portion 148 as shown in FIG. 40, for example.

Next, advantages of the structure of the memory cell array 200 and the manufacturing steps thereof will be described.

Even in the case of the present embodiment, similarly to in the first embodiment, variation in resistance distribution of the bit line BL caused by the void 143 can be suppressed.

Moreover, the memory cell array 100 of the first embodiment, as may be understood from its manufacturing steps, has a structure in which, as shown in FIG. 5, while there is no void covering film 125 between the bit line BL and the insulating film 123, the void covering film 125 remains between the word line WL and the insulating film 123. Therefore, in the case supposing manufacturing to be performed using an etching mask having the same L/S pattern, naturally, a structural difference occurs between the memory cell array 100 and the memory cell array 300 of the comparative example. For example, a length Lbl1 in the X direction of the bit line BL of the memory cell array 100 ends up being greater than a length in the X direction of the bit line BL of the memory cell array 300, by an amount of the void covering film 125 removed in the steps of FIGS. 22 and 23.

In that respect, in the case of the manufacturing steps of the memory cell array 200 of the present embodiment, the void covering film 125, excluding the protruding portion 148, is removed before deposition of the antioxidizing film 124. Moreover, regarding also the remaining protruding portion 148, this is removed after removal of the sacrifice film 142, hence the finally formed memory cell array 200, similarly to the memory cell array 300 of the comparative example, has a structure in which there is no void covering film 125. Therefore, in the case supposing manufacturing to be performed using an etching mask having the same L/S pattern, the memory cell array 200 and the memory cell array 300 can be manufactured with the same structure and size, excluding presence/absence of the void 143. For example, a length Lbl2 in the X direction of the bit line BL of the memory cell array 200 is the same as that of the memory cell array 300.

From the above, the second embodiment makes it possible to obtain similar advantages to those of the first embodiment while maintaining a similar structure to that of the comparative example.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a semiconductor substrate extending in a first direction and a second direction, the first and second directions intersecting each other;
   a first wiring line disposed above the semiconductor substrate and extending in the first direction;
   a second wiring line disposed above the semiconductor substrate and extending in a third direction, the third direction intersecting the first direction and the second direction;
   a variable resistance film disposed at an intersection of the first wiring line and the second wiring line;
   a first insulating film disposed aligned with the second wiring line in the first direction;
   a second insulating film disposed between the first wiring line and the first insulating film and aligned with the variable resistance film in the first direction; and
   a third insulating film disposed between the first insulating film and the second insulating film and configured from a material different from that of the second insulating film.

2. The semiconductor memory device according to claim 1, wherein
   the variable resistance film contacts the third insulating film in the first direction.

3. The semiconductor memory device according to claim 2, wherein
   the variable resistance film covers a periphery of a side surface along the third direction of the second wiring line, and contacts the third insulating film at a side surface in the first direction of the second wiring line.

4. The semiconductor memory device according to claim 3, wherein
   the third insulating film covers a periphery of a side surface along the third direction of the first insulating film, and contacts the variable resistance film at a side surface facing the second wiring line of the first insulating film.

5. The semiconductor memory device according to claim 2, wherein
   the second insulating film contacts the first wiring line at a surface where the first insulating film and the first wiring line face each other.

6. The semiconductor memory device according to claim 2, wherein
   the variable resistance film contacts the second insulating film in the first direction.

7. The semiconductor memory device according to claim 1, wherein
   the second insulating film is an oxide film, and
   the third insulating film is a nitride film.

8. The semiconductor memory device according to claim 1, wherein
   the first insulating film, the second insulating film and the third insulating film are made of different materials.

* * * * *